(12) United States Patent
Shao et al.

(10) Patent No.: US 9,997,467 B2
(45) Date of Patent: Jun. 12, 2018

(54) SEMICONDUCTOR PACKAGES AND METHODS OF FORMING THE SAME

(71) Applicant: Taiwan Semiconductor Manufacturing Company, Ltd., Hsin-Chu (TW)

(72) Inventors: Tung-Liang Shao, Hsin-Chu (TW); Chih-Hang Tung, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days. days.

(21) Appl. No.: 15/408,144

(22) Filed: Jan. 17, 2017

(65) Prior Publication Data
US 2018/0053730 A1 Feb. 22, 2018

Related U.S. Application Data

(60) Provisional application No. 62/377,415, filed on Aug. 19, 2016.

(51) Int. Cl.
| | |
|---|---|
| *H01L 21/48* | (2006.01) |
| *H01L 23/544* | (2006.01) |
| *H01L 23/538* | (2006.01) |
| *H01L 23/00* | (2006.01) |

(52) U.S. Cl.
CPC .......... *H01L 23/544* (2013.01); *H01L 21/481* (2013.01); *H01L 23/5389* (2013.01); *H01L 24/20* (2013.01); *H01L 24/82* (2013.01); *H01L 2223/54426* (2013.01)

(58) Field of Classification Search
CPC ... H01L 23/53; H01L 23/538; H01L 23/5389; H01L 23/54; H01L 23/544; H01L 21/48; H01L 21/481; H01L 24/20; H01L 24/82
USPC ........................................................ 257/688
See application file for complete search history.

(56) References Cited

U.S. PATENT DOCUMENTS

| | | | |
|---|---|---|---|
| 2009/0181500 A1 | 7/2009 | Kuhmann et al. | |
| 2010/0270579 A1 | 10/2010 | Jo | |
| 2013/0119553 A1* | 5/2013 | Jeong | ................. H01L 23/5389 257/774 |
| 2014/0286605 A1 | 9/2014 | Lee | |

FOREIGN PATENT DOCUMENTS

| | | |
|---|---|---|
| CN | 101877382 A | 11/2010 |
| TW | 200950007 A | 12/2009 |

* cited by examiner

*Primary Examiner* — Monica D Harrison
(74) *Attorney, Agent, or Firm* — Slater Matsil, LLP

(57) ABSTRACT

Semiconductor packages and methods of forming the same are disclosed. Embodiments include forming a first recess in a first substrate, wherein a first area of an opening of the first recess is larger than a second area of a bottom of the first recess. The embodiments also include forming a first device, wherein a third area of a top end of the first device is larger than a fourth area of a bottom end of the first device. The embodiments also include placing the first device into the first recess, wherein the bottom end of the first device faces the bottom of the first recess, and bonding a sidewall of the first device to a sidewall of the first recess.

20 Claims, 23 Drawing Sheets

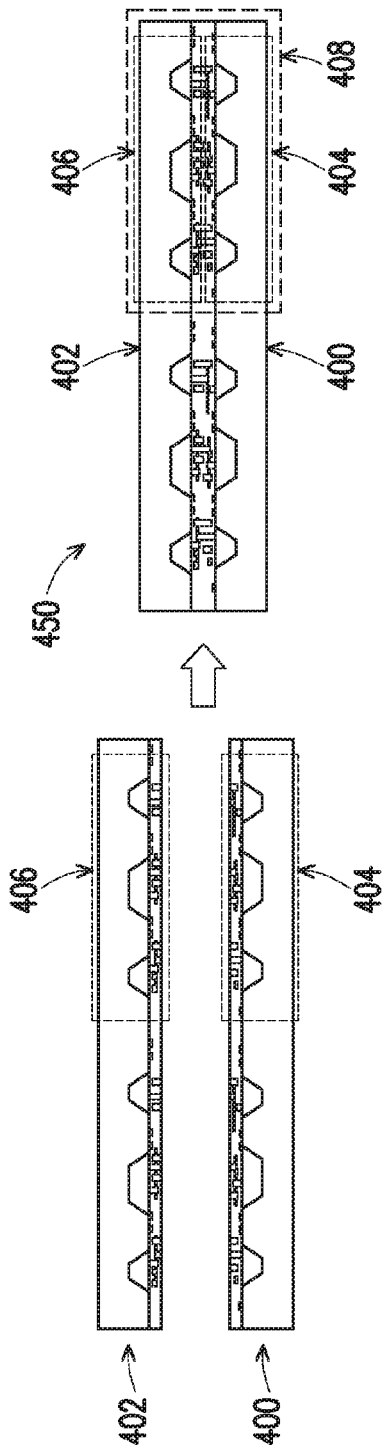
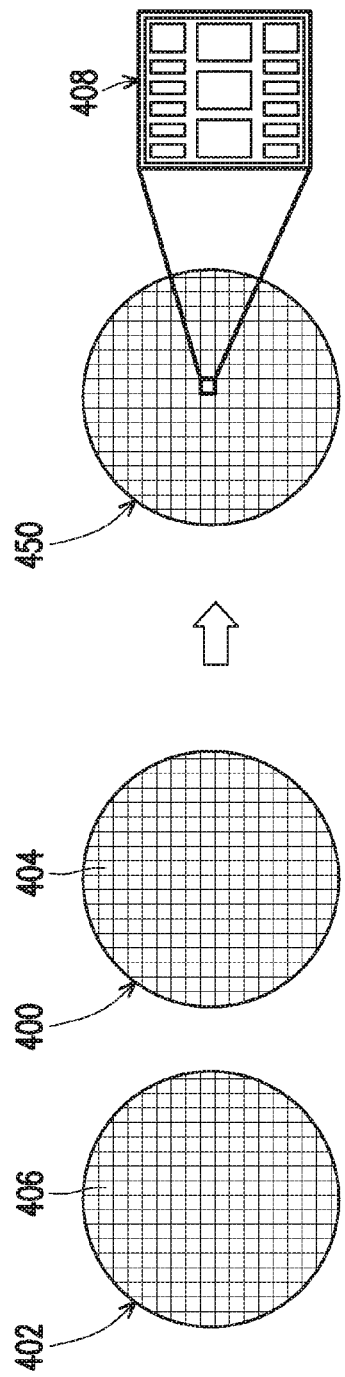
FIG. 4A
FIG. 4B
FIG. 4C
FIG. 4D

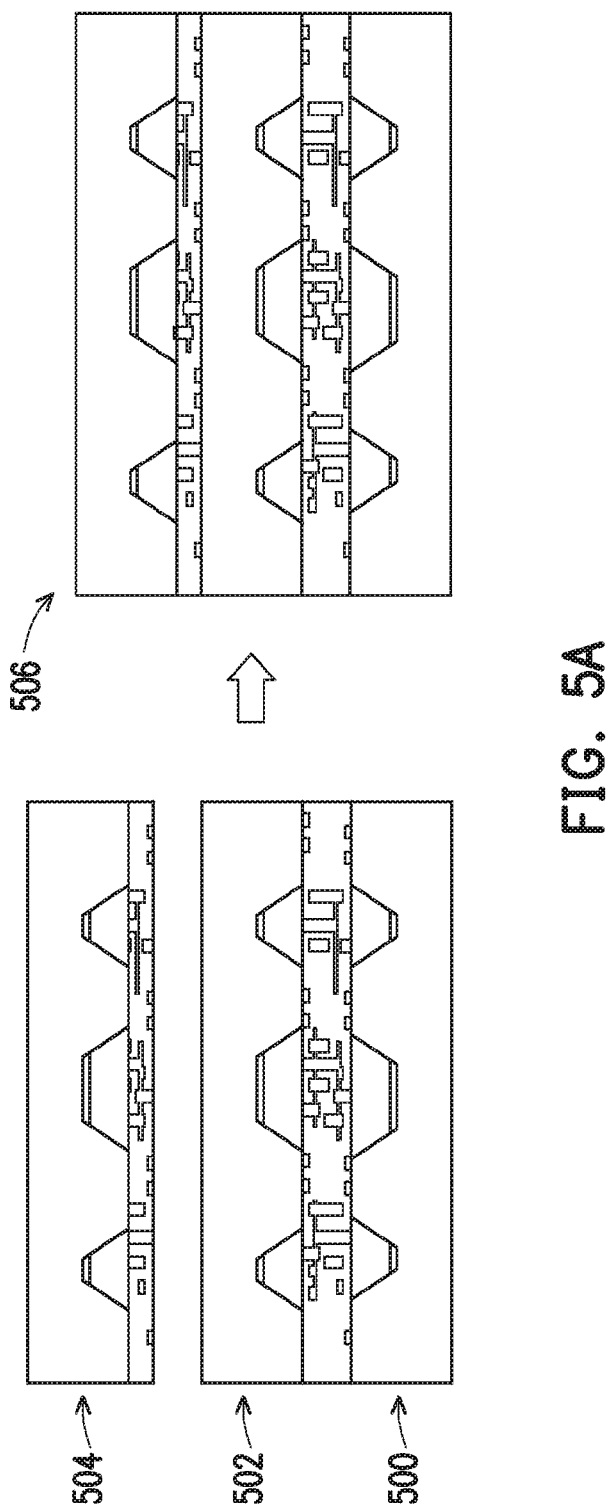

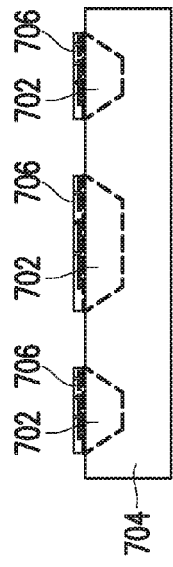
FIG. 7A
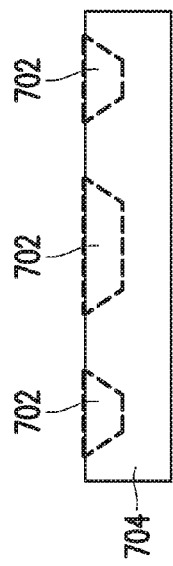
FIG. 7C
FIG. 7E
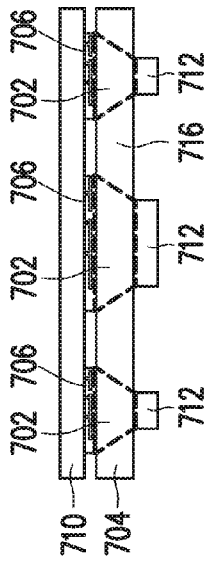
FIG. 7B
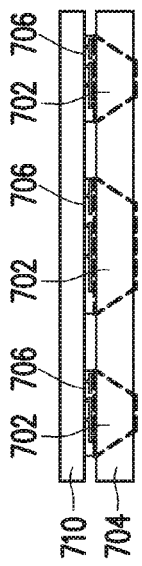
FIG. 7D
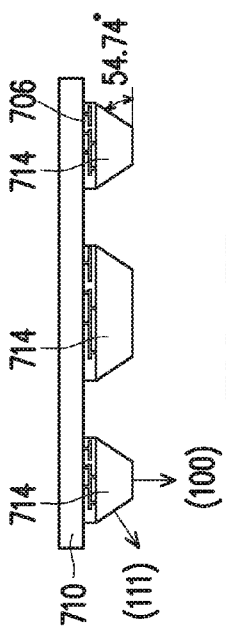

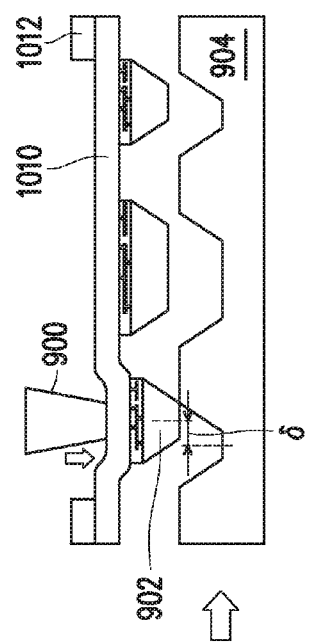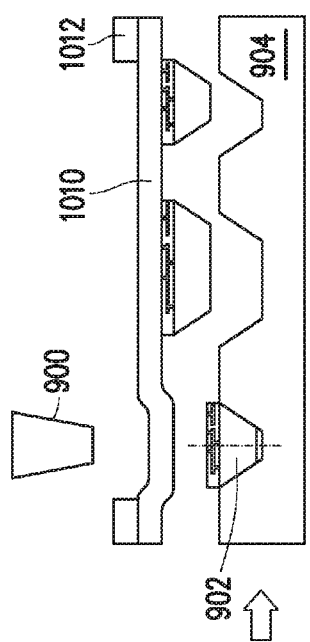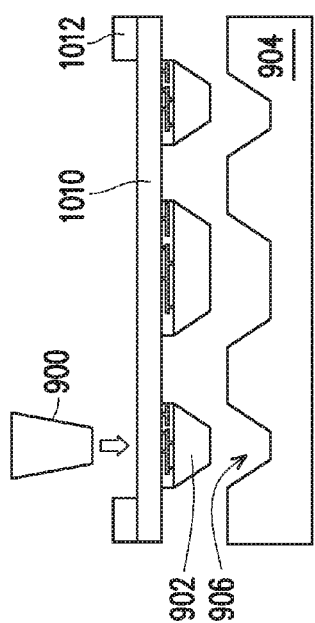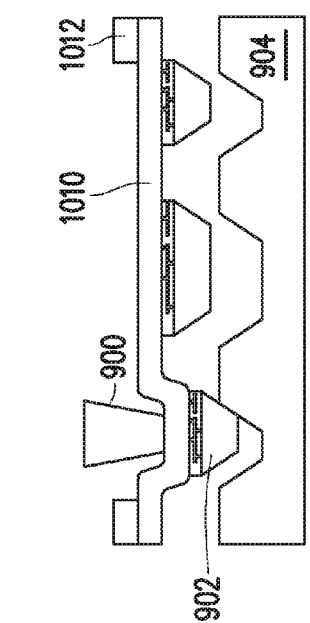
FIG. 10A
FIG. 10B
FIG. 10C
FIG. 10D

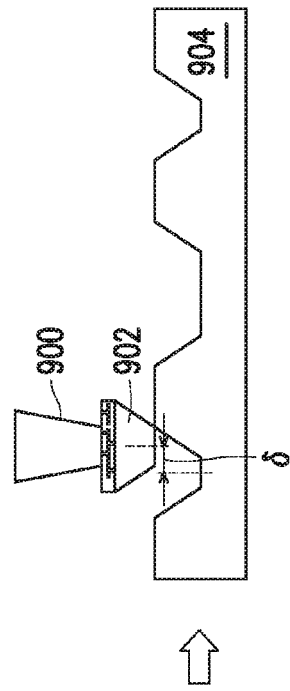
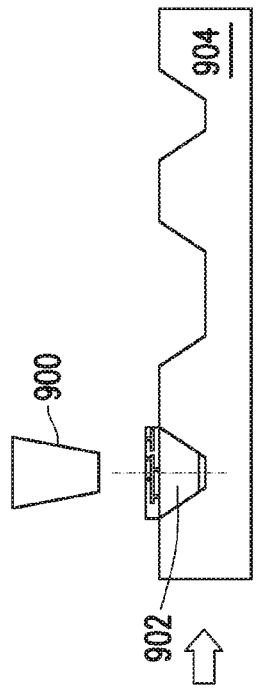
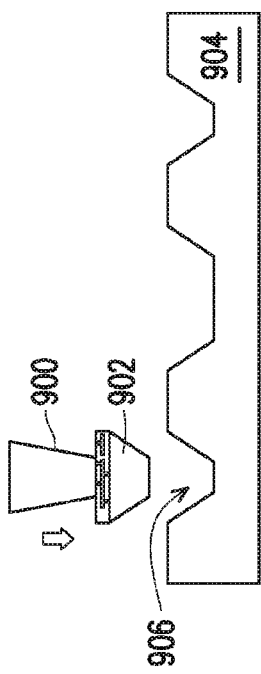
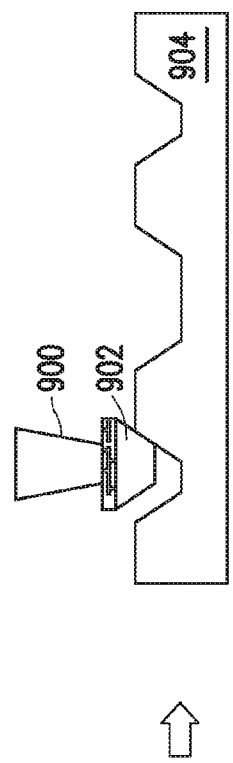

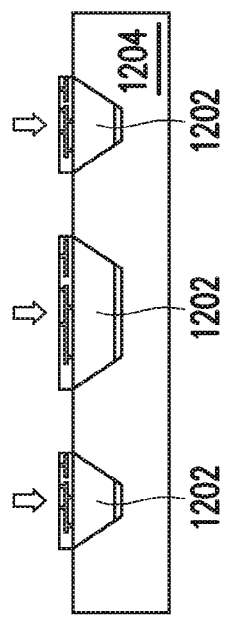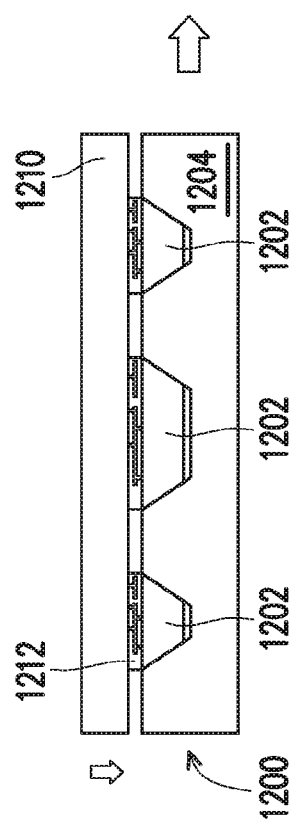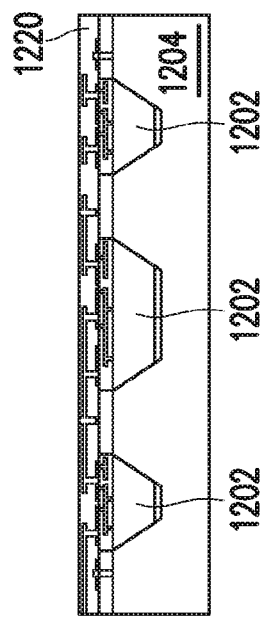

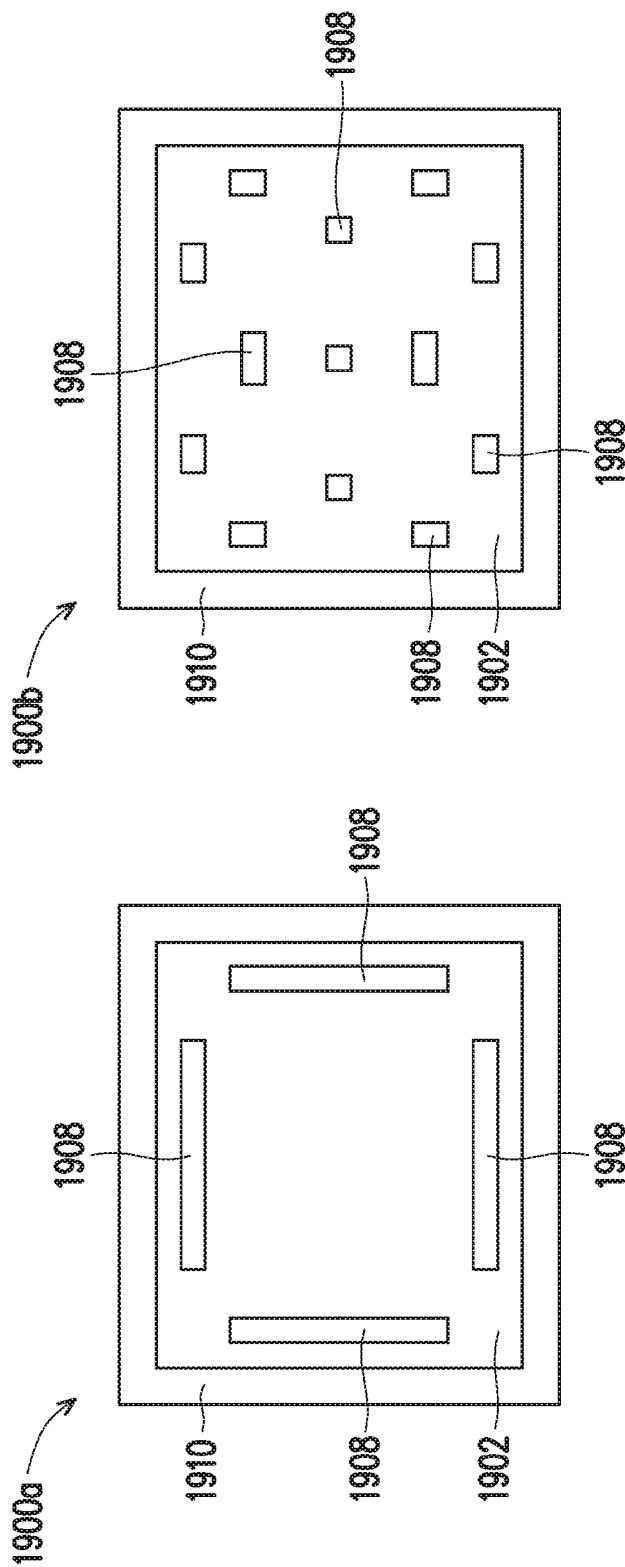

SEMICONDUCTOR PACKAGES AND METHODS OF FORMING THE SAME

PRIORITY CLAIM AND CROSS-REFERENCE

This application claims the benefit of U.S. Provisional Application No. 62/377,415, entitled "A Novel Self-align Chips/Chiplets Fan-Out and Stacking for Optimized Wafer Level System Integration," filed on Aug. 19, 2016, which application is incorporated herein by reference.

BACKGROUND

Since the invention of the integrated circuit (IC), the semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D IC formation, there are physical limits to the density that may be achieved in two dimensions. One of these limits is the minimum size needed to make these components. In addition, when more devices are put into one chip or die, more complex designs are required.

In an attempt to further increase circuit density, three-dimensional integrated circuits (3DICs) have been investigated. In a typical formation process of a 3DIC, two chips are bonded together and electrical connections are formed between each chip and contact pads on a substrate. For example, bonding two chips may be accomplished by attaching one chip on top of the other. The stacked chips are then bonded to a carrier substrate and wire bonds electrically couple contact pads on each chip to contact pads on the carrier substrate. However, this requires a carrier substrate larger than the chips for the wire bonding. More recent attempts have focused on flip-chip interconnections and the use of conductive balls/bumps to form a connection between the chip and the underlying substrate, thereby allowing high-wiring density in a relatively small package. Traditional chip stacking using solder joints involves solder, flux and underfill. All these processes created issues and limitations on pitch, joint height, and flux residue.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4D illustrate integrated-chiplets wafer-to-wafer bonding in accordance with some embodiments.

FIGS. 5A-5C illustrate integrated-chiplets wafer-to-wafer bonding in accordance with some embodiments.

FIGS. 7A-7E illustrate intermediate steps in the formation of chiplets in accordance with some embodiments.

FIGS. 10A-10D illustrate intermediate steps in the formation of an integrated-chiplets wafer in accordance with some embodiments.

FIGS. 11A-11D illustrate intermediate steps in the formation of an integrated-chiplets wafer in accordance with some embodiments.

FIGS. 12A-12C illustrate intermediate steps in the formation of an integrated-chiplets wafer in accordance with some embodiments.

FIGS. 19A-19C illustrate stacked wafer structures in accordance with some embodiments.

DETAILED DESCRIPTION

Figure 1A:
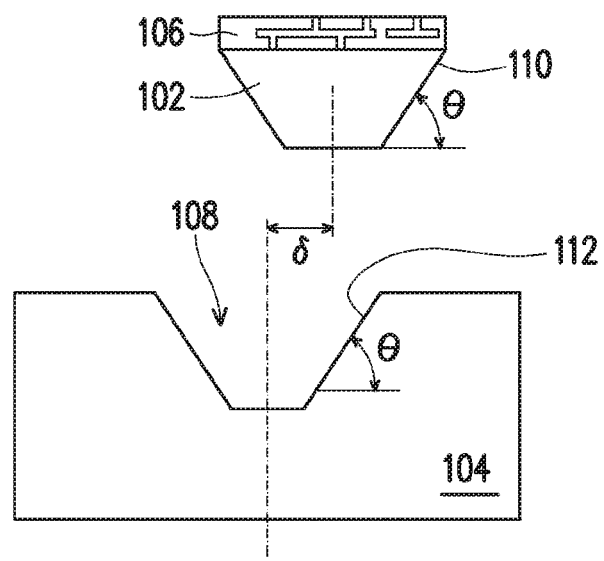
FIGS. 1A-1B illustrate an integrated-chiplet structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
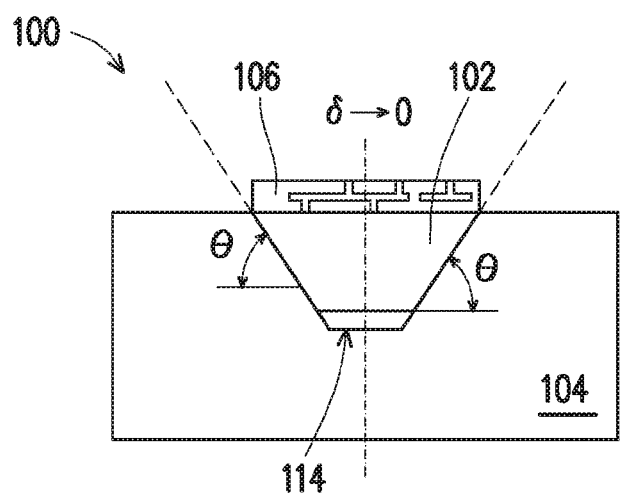

FIG. 1A and FIG. 1B illustrate aspects of forming an integrated-chiplet structure 100 in accordance with some embodiments. FIG. 1A shows an example chiplet 102 and an example substrate 104. FIG. 1B shows chiplet 102 after chiplet 102 has been placed into recess 108 in substrate 104. In some embodiments, a chiplet 102 may be a chip, an integrated circuit die, a semiconductor device, a memory chip, an interconnect structure, another type of device, or the like. The chiplet 102 may include or be formed from a semiconductor material such as Si, SiC, Ge, a III-V semiconductor material, a II-VI semiconductor material, another semiconductor material, a semiconductor-on-insulator (SOI) material, or the like. In some embodiments, the chiplet 102 is formed from one or more dielectric materials such as $SiO_2$, SiN, a polymer, or another dielectric material. The chiplet 102 may be formed using any suitable methods or manufacturing techniques as known in the art. Some embodiments of forming a chiplet 102 are described below with respect to FIGS. 6A-6D and FIGS. 7A-7D.

In some embodiments, an optional chiplet metallization layer 106 is disposed on the top surface of the chiplet 102. The chiplet metallization layer 106 may be formed over active and passive devices of the chiplet 102 and may connect the various devices to form an integrated circuit or a portion of an integrated circuit. The chiplet metallization layer 106 may interconnect devices formed on the chiplet 102, and may also provide external connections from the chiplet 102 to external devices or structures. The chiplet metallization layer 106 may be formed of alternating layers of dielectric and conductive material with vias interconnecting the layers of conductive material. The chiplet metallization layer 106 may be formed through any suitable process (such as deposition, damascene, dual damascene, or the like). In some cases the chiplet metallization layer 106 may be formed in a back-end-of-line (BEOL) stage of a manufacturing process. In some embodiments, the chiplet metallization layer 106 includes a redistribution layer (RDL).

In some embodiments, a chiplet 102 may have a plan view area of between about 1 $\mu m^2$ to about 10000 $\mu m^2$, such as about 100 $\mu m^2$. For example, a chiplet 102 may have plan view dimensions of about 10 $\mu m \times 10$ $\mu m$, or other dimensions. In some embodiments, a chiplet 102 has a plan view area less than 1 $\mu m^2$ or greater than 10000 $\mu m^2$. A chiplet 102 may have a square shape in plan view, a rectangular shape in plan view, or another shape in plan view. In some embodiments, a chiplet 102 has a thickness between about 1 $\mu m$ to about 500 $\mu m$, such as about 2 $\mu m$, 10 $\mu m$, 50 $\mu m$, or another thickness. In some embodiments, a chiplet 102 has a thickness smaller than 1 $\mu m$ or greater than 500 $\mu m$.

In some embodiments, the substrate 104 is a wafer made of glass, silicon (e.g., a silicon wafer) or another semiconductor material, silicon oxide or other dielectric material, an SOI wafer, or the like. In some embodiments, the substrate 104 is made of metal, a ceramic material, a plastic or other polymer material, a combination, or the like. In some embodiments, the substrate 104 is a device wafer, an interposer, die, or integrated circuit, and may include active or passive devices, metallization layers, passivation layers, vias, a combination, or the like. In some embodiments, the substrate 104 is a carrier, blank carrier wafer, boat, frame, package, or the like.

The substrate 104 includes a recess 108 that is shaped to receive the chiplet 102. In some embodiments, the recess 108 is formed in one or more dielectric layers disposed on a surface of the substrate 104. FIG. 1B shows the chiplet 102 placed into the recess 108. In some embodiments, when the chiplet 102 is placed in the recess 108, a top surface of the chiplet 102 is substantially level with a top surface of the substrate 104 (as shown in FIG. 1B), though in other embodiments a top surface of the chiplet 102 may be above or below a top surface of the substrate 104. In some embodiments, a top surface of the chiplet metallization layer 106 may be substantially level with a top surface of the substrate 104. In some embodiments, the depth of the recess 108 is greater than a thickness of the chiplet 102 such that a gap 114 is present between a bottom surface of the chiplet 102 and a bottom surface of the recess 108. In this manner, effects due to variations in the thickness of the chiplet 102 or the depth of the recess 108 may be reduced.

After placement within the recess 108, the chiplet 102 may be bonded to the substrate 104. In some embodiments, the chiplet 102 is bonded to the substrate 104 using a direct bonding process. For example, the chiplet-substrate bonding process may form a Si—Si bond, a SiO—SiO bond, a Si—SiO bond, or another type of direct bond. In some embodiments, an intermediate layer is used between the chiplet 102 and the substrate 104 for chiplet-substrate bonding. The intermediate layer may be an adhesive layer, an epoxy, a resin, a polymer, or another type of bonding material. The chiplet-substrate bonding process may include, for example, surface preparation steps, one or more anneals, water immersion, or other techniques as known in the art.

In some embodiments, a sidewall 110 of the chiplet 102 and a corresponding sidewall 112 of the recess 108 may have a similar shape or have a similar profile. More than one chiplet sidewall 110 and more than one recess sidewall 112 may have corresponding shapes or profiles. In this manner, some or all of the area of chiplet sidewalls 110 and the recess sidewalls 112 may be physically contacting. For example, in the illustrative embodiments shown in FIG. 1A, the chiplet sidewalls 110 are planar and have an angle of θ, and the recess sidewalls 112 are also planar with an angle of θ. Thus, as shown in FIG. 1B, when the chiplet 102 is placed in the recess 108, the similarly angled sidewalls allow portions of the chiplet sidewalls 110 to be parallel with and physically contact portions of the recess sidewalls 112. Having similarly-shaped sidewalls may allow more contacting surface area between the chiplet 102 and the substrate 104, which may improve bonding between the chiplet 102 and the substrate 104. Moreover, having similar sidewalls may also allow improved alignment of the chiplet 102 within the recess 108, described in greater detail below.

In some embodiments, the sidewalls of a chiplet or a recess may not be straight or planar as shown in FIGS. 1A-1B. In other embodiments, some or all of the sidewalls may be curved, different portions of the sidewalls may have different angles, or the sidewalls may have an irregular shape. The chiplet or recess may have one or more sidewalls with a substantially constant sidewall angle. For example, the sidewall angle may be constant within normal process variations. The chiplet may have one or more sidewalls that are not substantially perpendicular to a top or bottom surface of the chiplet. The recess may have one or more sidewalls that are not substantially perpendicular to the top surface of the substrate or the bottom surface of the recess. In some cases, the sidewalls of the chiplet or of the recess are symmetric. In some cases, different sidewalls of a chiplet may have different shapes and different sidewalls of a recess may have different shapes.

In some cases, chiplet sidewalls 110 and recess sidewalls 112 as described herein may allow increased placement misalignment tolerance and may also allow self-alignment of the chiplet 102 during placement. For example, in FIG. 1A, the chiplet sidewalls 110 are angled inward toward the bottom of the chiplet 102 and the recess sidewalls 112 shown in FIG. 1A are angled inward toward the bottom of the recess. During chiplet 102 placement, if the chiplet 102 is not aligned or centered to the recess 108 (shown as a misalignment δ in FIG. 1A), a chiplet sidewall 110 will impinge on and slide against a recess sidewall 112 as the chiplet 102 moves down into the recess 108. The similar angles of the chiplet sidewall 110 and recess sidewall 112 cause the chiplet 102 to shift laterally toward a centered position as the chiplet 102 moves down into the recess 108. The chiplet 102 may move down into the recess 108 until two or more impinging sidewalls prevent further lateral or downward movement, or until the bottom of the chiplet 102 impinges on the bottom of the recess 108. In this manner, the chiplet 102 may self-align during placement, and an initial placement misalignment of δ may be reduced to zero or near-zero after placement. In some cases, a top surface of the chiplet 102 may be substantially level with a top surface of the substrate 104 after placement, and in some cases, the top surface of the chiplet 102 may be above or below the top surface of the substrate 104 after placement.

This self-aligning behavior may allow increased misalignment tolerance during placement. In some cases, the chiplet 102 may self-align if at least the bottom of a chiplet sidewall 110 is over at least the top of a recess sidewall 112. Thus, there is a lateral misalignment tolerance over which the chiplet 102 may self-align during placement. The misalignment tolerance for other chiplets, recesses, and embodiments depends on factors such as the angle or shape of the chiplet sidewalls and recess sidewalls, the thickness and size of the chiplet, and the depth and size of the recess. In some cases, the misalignment tolerance may be as large as about 700 μm, though in other cases the misalignment tolerance may be less than or greater than about 700 μm. A larger misalignment tolerance may enable faster chiplet placement, as the placement tool may not require as much time to precisely align the chiplet to the corresponding recess. Moreover, the self-aligning behavior of the chiplets described herein may result in chiplets having a near-zero misalignment after placement despite a large misalignment tolerance during placement.

Figure 2A:
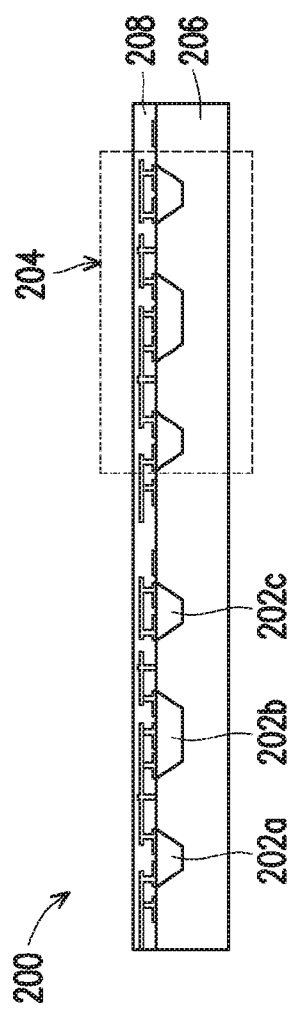
FIGS. 2A-2C illustrate an integrated-chiplet wafer in accordance with some embodiments.
Figure 2C:
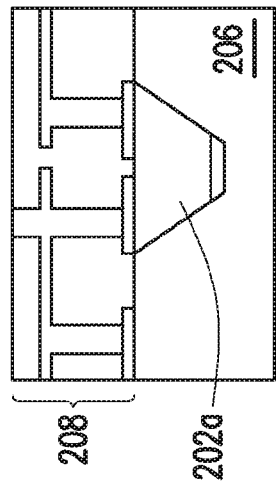
Figure 2B:
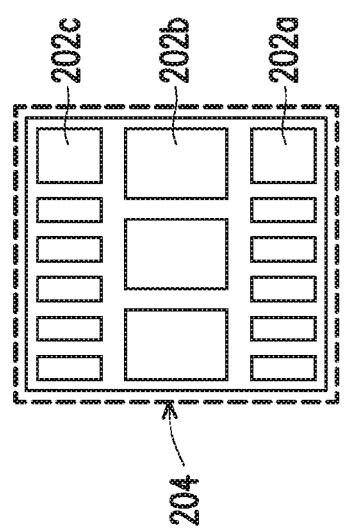

FIGS. 2A-2C illustrate aspects of an integrated-chiplets wafer 200 in accordance with some embodiments. The integrated-chiplets wafer 200 includes multiple chiplets 202a-c integrated into a single wafer 206. Some of the chiplets 202a-c have been indicated in FIGS. 2A-2C, though more or fewer chiplets than shown may be integrated into a wafer 206. The wafer 206 may be a semiconductor wafer (e.g., a silicon wafer) or a different type of wafer or substrate such as described above with respect to substrate 104 in FIGS. 1A-1B. The individual chiplets 202a-c may be the same or be different devices or different types of chiplets as described previously (e.g., chiplet 102 shown in FIGS. 1A-1B). For example, some chiplets 202a-c may be different integrated dies than other chiplets 202a-c. The chiplets 202a-c may also be formed from different materials. For example, on a single wafer 206, one chiplet 202a may be formed from silicon, another chiplet 202b may be formed from GaAs, and a third chiplet 202c may be formed from GaN. Other materials and combinations of chiplets 202a-c are possible. Moreover, the chiplets 202a-c may be formed using different processing technologies, and may have different sizes, shapes, thicknesses, etc. In this manner, heterogeneous chiplets may be integrated on a single wafer or substrate.

In some embodiments, each chiplet is tested before its placement into its recess. After chiplet testing, only good chiplets may be selected for use in an integrated-chiplets wafer. In this manner, an integrated-chiplets wafer may have a high Known Good Die (KGD). Chiplet testing may thus increase overall yield for devices that incorporate integrated-chiplets die, such as the packages described below in FIGS. 3A-3C.

FIGS. 2A-2C illustrate integrated-chiplet wafer 200 including an optional RDL 208 formed over the chiplets 202a-c and the wafer 206. The RDL 208 may include contacts to the chiplets 202a-c and the wafer 206 and interconnections between the chiplets 202a-c and the wafer 206, as shown in greater detail in FIG. 2C. In some embodiments, the RDL 208 may be formed in a BEOL stage of a manufacturing process. In this manner, a single RDL formation process may be used to interconnect multiple chiplets, including chiplets of different types as described previously. In some embodiments, some chiplets 202a-c include chiplet metallization layers such as chiplet metallization layer 106 described above in FIGS. 1A-1B. The RDL 208 may be disposed over and connected to chiplet metallization layers. In some cases, the use of chiplet metallization layers on chiplets may reduce the number of layers that an overlying RDL would otherwise require.

In some embodiments, the integrated-chiplet wafer 200 includes multiple integrated-chiplet dies. An example integrated-chiplet die 204 is shown in cross-section in FIG. 2A and in plan view in FIG. 2B. Each of the integrated-chiplet dies may be singulated from the integrated-chiplet wafer 200, as shown in FIG. 2B. Integrated-chiplet dies may include multiple different chiplets positioned adjacently in different arrangements.

Figure 3A:
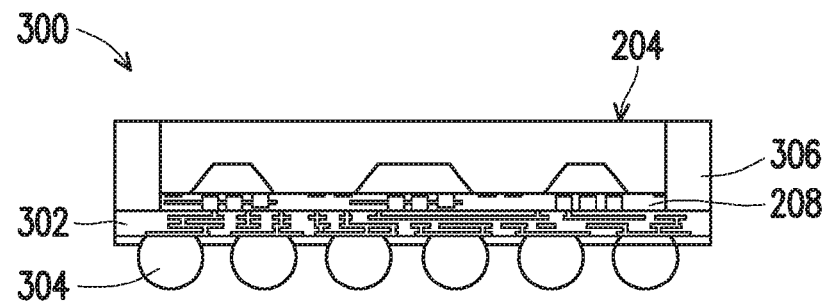
FIGS. 3A-3C illustrate integrated-chiplets packages in accordance with some embodiments.
Figure 3B:
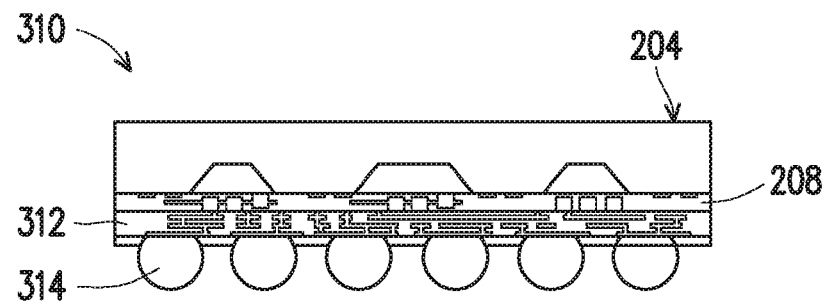
Figure 3C:
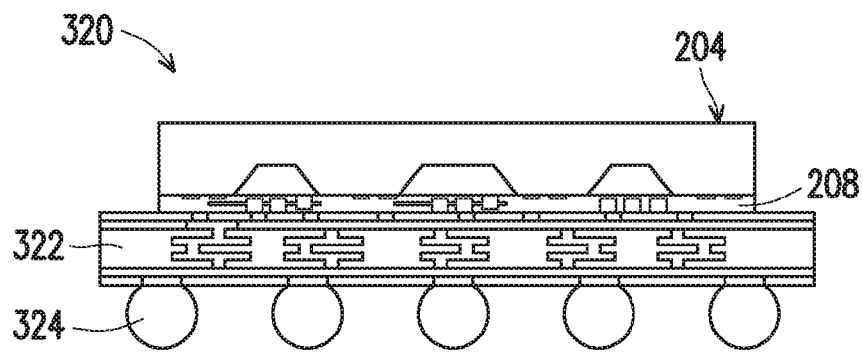

FIGS. 3A-3C illustrate aspects of packaged integrated-chiplet dies in accordance with some embodiments. FIG. 3A illustrates an example Integrated Fan-Out (InFO) structure 300 using an integrated-chiplets die 204. The integrated-chiplets die 204 may include one or more chiplets (e.g., chiplet 102 shown in FIGS. 1A-1B). In the example InFO structure 300, the RDL 208 of the die 204 is bonded or otherwise connected to a package RDL 302 of the InFO structure 300. The die RDL 208 and the package RDL 302 may be electrically connected and form interconnections between chiplets and other devices within the InFO structure 300. The package RDL 302 is connected to external connectors 304. The width of the die 204 is smaller than the width of the InFO structure 300, and the die 204 is surrounded by an encapsulant 306.

FIG. 3B illustrates an example Integrated Fan-In (InFI) structure 310 using an integrated-chiplets die 204. In the example InFI structure 310, the RDL 208 of the integrated-chiplets die 204 is bonded or otherwise connected to a package RDL 312 of the InFI structure 310. The die RDL 208 and the package RDL 312 may be electrically connected and form interconnections between chiplets and other devices within the InFI structure 310. The package RDL 312 is connected to external connectors 314. The width of the die 204 is the same or larger than the width of the InFI structure 310.

FIG. 3C illustrates an example Flip-Chip Chip-Scale Package (FCCSP) structure 320 using an integrated-chiplets die 204. In the example FCCSP structure 320, the RDL 208 of the integrated-chiplets die 204 is bonded or otherwise connected to a package RDL 322 of the FCCSP structure 320. The die RDL 208 and the package RDL 322 may be electrically connected and form interconnections between chiplets and other devices within the FCCSP structure 320. The package RDL 322 is connected to external connectors 314.

FIGS. 3A-3C show some example integrated-chiplets packages, but other types of packages incorporating an integrated-chiplets die are possible. In some embodiments, an integrated-chiplets die may be used in InFO, InFI FCCSP, Chip-on-Wafer-on-Substrate (CoWoS), or other types of packages without the use of through-substrate-vias (TSVs) or an interposer. In some embodiments, using an RDL formed on an integrated-chiplets die may reduce the complexity or number of layers needed for the package RDL. Moreover, using a standard BEOL process to form an RDL on the integrated-chiplets die may reduce the overall complexity or number of process steps needed to form an integrated-chiplets package.

FIGS. 4A-4D illustrate intermediate steps in a wafer-to-wafer bonding process in accordance with some embodiments. FIG. 4A illustrates an example cross-section of a first integrated-chiplets wafer 400 and a second integrated-chiplets wafer 402, and FIG. 4C illustrates a plan view of first wafer 400 and second wafer 402. The first integrated-chiplets wafer 400 includes multiple first integrated-chiplets dies 404, and the second integrated-chiplets wafer 402 includes multiple second integrated-chiplets dies 406. Each of the integrated-chiplets dies 404, 406 may include one or more chiplets (e.g., chiplet 102 shown in FIGS. 1A-1B). FIG. 4B illustrates an example cross-section of first wafer 400 bonded to second wafer 402 to form stacked wafer structure 450, and FIG. 4D illustrates a plan view of first wafer 400 and second wafer 402 bonded to form stacked wafer structure 450. The first wafer 400 may be bonded to the second wafer 402 using direct bonding, dielectric bonding, metal bonding, hybrid bonding, or another bonding technique. The first wafer 400 and the second wafer 402 may be bonded such that the surfaces with chiplets are facing each other ("face-to-face"). Moreover, the RDLs on each wafer 400, 402 may be bonded together to form interconnections between the RDLs and chiplets on both wafers. For example, the wafers 400, 402 may be aligned such that contact pads on the RDLs are electrically connected after bonding. In some cases, an intermediate interconnect layer, substrate, or interposer may be disposed between the wafers 400, 402. In other embodiments, an integrated-chiplets wafer may be bonded to a different type of wafer or substrate.

The wafers 400, 402 may be bonded such that the first dies 404 are aligned to the second dies 406 to form stacked dies 408 in stacked wafer structure 450. The stacked dies 408 may be singulated from the stacked wafer structure 450 after bonding. In some embodiments, the chiplets are tested prior to placement on the wafers 400, 402. By using only known good chiplets, the likelihood of an integrated-chiplets die being good may be greatly increased. In this manner, the first wafer 400 may contain a high KGD of first dies 404 and the second wafer 402 may contain a high KGD of second dies 406. This may result in a stacked wafer structure 450 that contains a high KGD of stacked dies 408. In some cases the dies 404, 406 may also be tested prior to bonding. In some cases, the KGD of wafers 400, 402 and stacked wafer structure 450 may be at or near 100%. In some cases, the first dies 404 have about the same area as the second dies 408, and thus an area penalty due to die area mismatch may be reduced or eliminated.

Figure 5B:
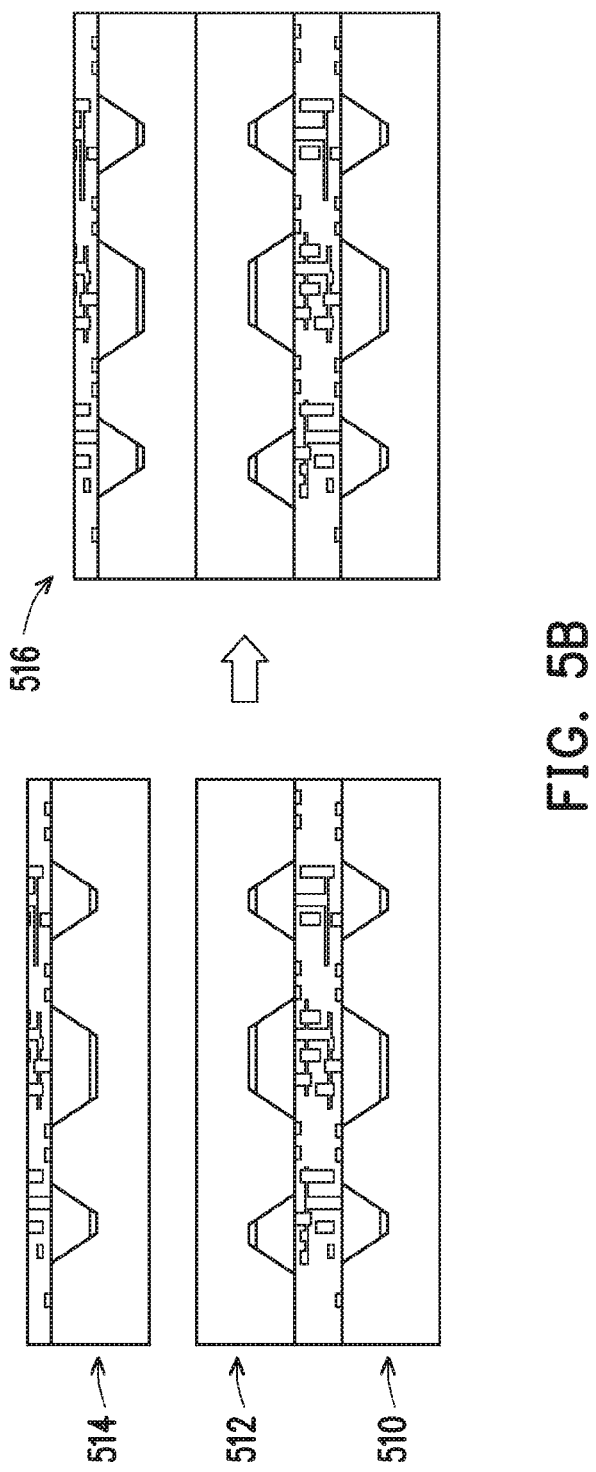
Figure 5C:
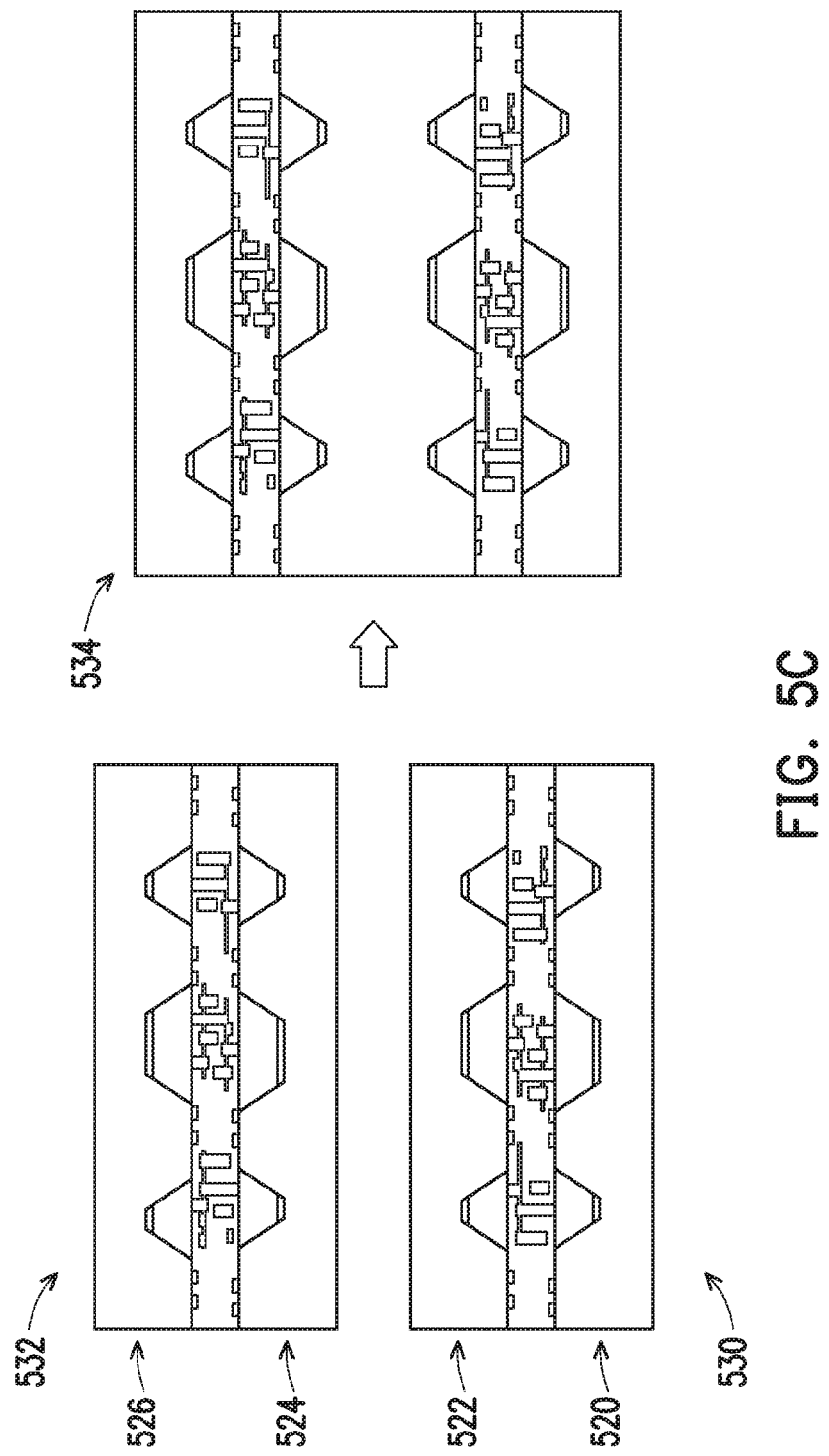

FIGS. 5A-5C illustrate aspects of other stacked integrated-chiplets wafer configurations according to an embodiment. Each of the integrated-chiplets wafers may include one or more chiplets (e.g., chiplet 102 shown in FIGS. 1A-1B) or integrated-chiplets dies (e.g., integrated-chiplets die 204 shown in FIGS. 2A-2C). For example, in FIG. 5A, integrated-chiplets wafer 500 is bonded face-to-face to integrated-chiplets wafer 502, and integrated-chiplets wafer 504 is bonded face-down to wafer 502. This forms a first 3-tier stacked wafer 506. In FIG. 5B, integrated-chiplets wafer 510 is bonded face-to-face to integrated-chiplets wafer 512, and integrated-chiplets wafer 514 is bonded face-up to wafer 512. This forms a second 3-tier stacked wafer 516. In FIG. 5C, integrated-chiplets wafer 520 is bonded face-to-face to integrated-chiplets wafer 522 to form first stacked wafer 530, and integrated-chiplets wafer 524 is bonded face-to-face to integrated-chiplets wafer 526 to form second stacked wafer 532. The first stacked wafer 530 is bonded to the second stacked wafer 532 to form a 4-tier stacked wafer 534. In other embodiments, one or more integrated-chiplets wafers may be bonded to one or more different types of wafers, and bonded to more or fewer wafers than shown in FIGS. 5A-5C. The wafers may be bonded using direct bonding, dielectric bonding, metal bonding, hybrid bonding, or another bonding technique. In some cases, one or more through-substrate-vias (TSVs) through a wafer may be used to form internal or external connections to the chiplets, RDLs, or other structures. Other combinations, configurations, connections, or bonding procedures are possible for forming stacked wafers including at least one integrated-chiplets wafer. In some cases, some or all of the integrated-chiplets wafers may have integrated-chiplets dies with the same area.

Figure 6A:
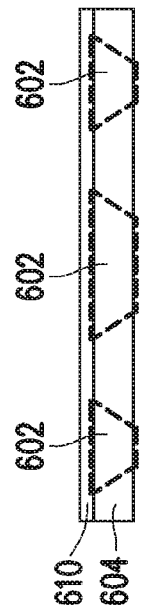
FIGS. 6A-6D illustrate intermediate steps in the formation of chiplets in accordance with some embodiments.

FIGS. 6A-6D illustrate intermediate steps in the formation of chiplets 614 according to an embodiment. The individual chiplets 614 may be the same or be different devices or different types of chiplets as described previously (e.g., chiplet 102 shown in FIGS. 1A-1B). FIG. 6A shows an example substrate 604 and chiplet regions 602. The chiplet regions 602 indicate where chiplets 614 are to be formed from the substrate 604. The example substrate 604 may be a semiconductor substrate (e.g., a silicon substrate, a SOI substrate, a GaAs substrate, or another semiconductor substrate) or another type of substrate material as described previously. The substrate 604 has been processed such that chiplet regions 602 contain circuits, transistors, resistors, other passive and active devices, etc. For example, integrated circuits may be formed in each chiplet region 602 using manufacturing techniques as known in the art. In some embodiments, a chiplet metallization layer is formed over the substrate 604.

Figure 6B:
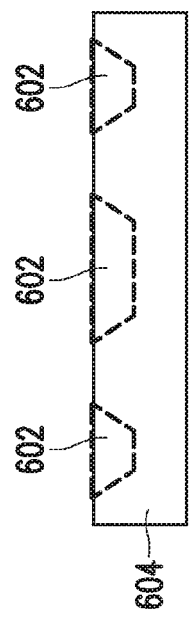

FIG. 6B shows the substrate 604 after a supporting layer 610 has been formed over the surface of the substrate 604. The supporting layer 610 may be SiN, an oxide, another dielectric material, a polymer, or another material. The bottom of the substrate 604 may also be thinned as shown in FIG. 6B. The thinning of substrate 604 may be achieved, for example, by an etching process and/or a planarization process, such as a mechanical grinding process or a chemical mechanical polishing (CMP) process. The substrate 604 may be thinned to about the bottom surfaces of the chiplet regions 602, as shown in FIG. 6B. In some embodiments, the thinning process is not performed or performed at a different step than shown.

Figure 6C:
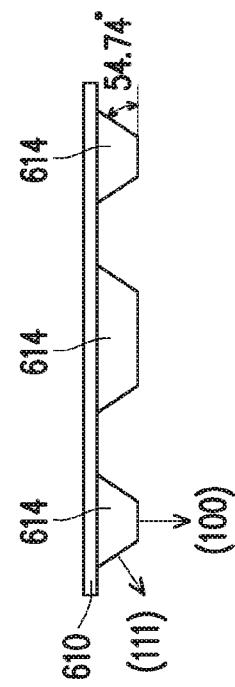

FIG. 6C shows the substrate 604 with a mask 612 disposed on its bottom surface. The mask 612 has been patterned to protect the chiplet regions 602 during a subsequent etch step. The mask 612 may be, for example, a photoresist or hardmask and may be patterned using any suitable photolithography technique.

Figure 6D:
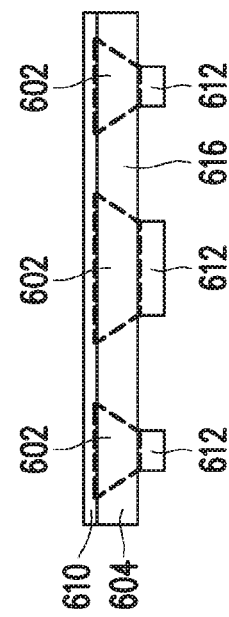

After the mask 612 has been patterned, sacrificial portions of the substrate 604 are etched to isolate the chiplet regions 602. An example sacrificial portion 616 between chiplet regions 602 is labeled in FIG. 6C. After etching the sacrificial portions of the substrate 604, isolated chiplets 602 remain attached to the supporting layer 610. The mask 612 is removed after the chiplets 614 have been isolated. FIG. 6D shows isolated chiplets 614 attached to the supporting layer 610.

The sacrificial portions of the substrate 604 may be removed using any suitable wet or dry etch technique. For example, in an embodiment in which the substrate 604 is silicon with a (100) orientation, an anisotropic etchant may be used such as KOH, EDP, TMAH, or another etchant. In this example, the anisotropic etchant may result in each chiplet 614 having substantially planar sidewalls corresponding to a (111) silicon orientation. The chiplet 614 sidewalls have an angle of about 54.74° corresponding to a (111) silicon orientation. Other suitable substrates with anisotropic etchants may be used, such as GaAs, GaN, or others. The use of an anisotropic etchant may allow more reproducibility in sidewall angle and planarity. However, in other embodiments isotropic etching, dry etching, or combinations of etching techniques may be used to isolate chiplets and shape chiplet sidewalls, including forming chiplet sidewalls having other angles.

FIGS. 7A-7E illustrate intermediate steps in the formation of chiplets 714 according to an embodiment. The individual chiplets 714 may be the same or be different devices or different types of chiplets as described previously (e.g., chiplet 102 shown in FIGS. 1A-1B). FIG. 7A shows an example substrate 704 and chiplet regions 702. The chiplet regions 702 indicate where chiplets 714 are to be formed from the substrate 704. The example substrate 704 may be a semiconductor substrate or another type of substrate material as described previously. The substrate 704 has been processed to form chiplet regions 702 as described previously.

FIG. 7B illustrates an optional chiplet metallization layer 706 formed over the chiplet regions 702. In some embodiments, the chiplet metallization layer 706 is formed over the substrate 704 and then portions of the chiplet metallization layer 706 between the chiplet regions 702 are removed. The portions of the chiplet metallization layer 706 may be removed through photolithographic patterning and etching as known in the art. In other embodiments, the chiplet metallization layer 706 is not used.

FIG. 7C illustrates a carrier 710 affixed to substrate 705 at the chiplet metallization layer 706. In some cases, the carrier 710 may be affixed by an adhesive or be an adhesive material itself. The carrier 710 may be a glass carrier, a ceramic carrier, a wafer, frame, plate, substrate, or the like. The carrier 710 may also be a tape, film (e.g., a die-attach film or other film), polymer, or the like. The carrier 710 may be rigid or flexible.

The bottom of the substrate 704 may also be thinned as shown in FIG. 7C. The thinning of substrate 704 may be achieved, for example, by an etching process and/or a planarization process, such as a mechanical grinding process or a chemical mechanical polishing (CMP) process. The substrate 704 may be thinned to about the bottom surfaces of the chiplet regions 702, as shown in FIG. 7C. In some embodiments, the thinning process is not performed or performed at a different step than shown.

FIG. 7D shows the substrate 704 with a mask 712 disposed on its bottom surface. The mask 712 has been patterned to protect the chiplet regions 702 during a subsequent etch step. The mask 712 may be, for example, a photoresist or hardmask and may be patterned using any suitable photolithography technique.

After the mask 712 has been patterned, sacrificial portions of the substrate 704 are etched to isolate the chiplet regions 702. An example sacrificial portion 716 between chiplet regions 702 is labeled in FIG. 7D. After etching the sacrificial portions of the substrate 704, isolated chiplets 714 remain attached to the carrier 710. The mask 712 is removed after the chiplets 714 have been isolated. FIG. 7E shows isolated chiplets 714 attached to the carrier 710.

Similar to the embodiment described above with respect to FIGS. 6A-6D, the sacrificial portions of the substrate 704 may be removed using any suitable wet or dry etch technique. In some embodiments, an anisotropic etch may be used to isolate the chiplets 714. As an illustrative example, FIG. 7E shows chiplet 714 sidewalls having an angle of about 54.74° corresponding to a (111) silicon orientation after an anisotropic etch. However, in other embodiments isotropic etching, dry etching, or combinations of etching techniques may be used to isolate chiplets and shape chiplet sidewalls.

Figure 8A:
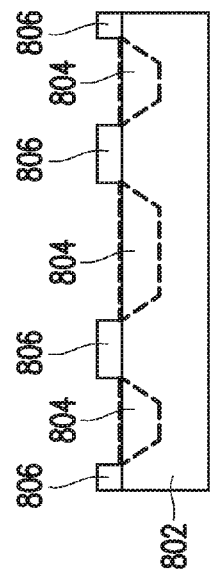
FIGS. 8A-8C illustrate intermediate steps in the formation of a substrate of an integrated-chiplets structure in accordance with some embodiments.
Figure 8B:
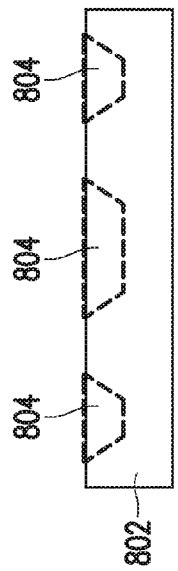
Figure 8C:
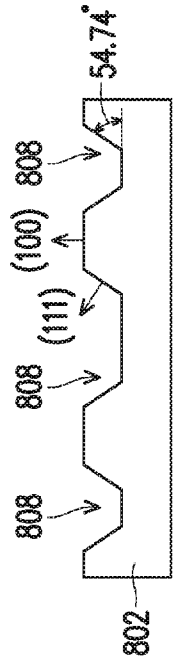

FIGS. 8A-8C illustrate intermediate steps in the formation of recesses 808 in a substrate 802 according to an embodiment. The individual recesses 808 may be similar to recesses described previously herein (e.g., recess 108 shown in FIGS. 1A-1B). FIG. 8A shows an example substrate 802 and recess regions 804. The recess regions 804 indicate where recesses 808 are to be formed within the substrate 802. The example substrate 802 may be a semiconductor substrate or another type of substrate material as described previously.

FIG. 8B shows the substrate 802 with a mask 806 disposed on its top surface. The mask 806 has been patterned to protect portions of the substrate 802 adjacent the recess regions 804 during a subsequent etch step. The mask 806 may be, for example, a photoresist or hardmask and may be patterned using any suitable photolithography technique.

FIG. 8C illustrates the substrate 802 after recess regions 804 have been etched to form recesses 808. The recess regions 804 may be may be removed using any suitable wet or dry etch technique, including a etch technique similar to the chiplet isolation etch described above. In some embodiments, an anisotropic etch may be used to isolate the recess regions 804. For example, KOH or another anisotropic etchant may be used to etch recess regions 804 in a silicon substrate. For example, FIG. 8C shows recess 808 sidewalls having an angle of about 54.74° corresponding to a (111) silicon orientation after an anisotropic etch. However, in other embodiments isotropic etching, dry etching, or combinations of etching techniques may be used to form recesses and shape recess sidewalls.

In some cases, a chiplet and a corresponding recess may be formed by a similar anisotropic etch, and thus have planar sidewalls with the same sidewall angle. For example, a chiplet and a substrate both may be silicon and both etched using a similar anisotropic etchant, such that both the chiplet and the recess may have sidewall angles of about 54.74°. Forming chiplet sidewalls and recess sidewalls using similar techniques may allow improved chiplet self-alignment and improved chiplet-substrate bonding. In other cases, chiplets and a substrate may be formed from different materials or etched using different etchants or techniques.

Figure 9A:
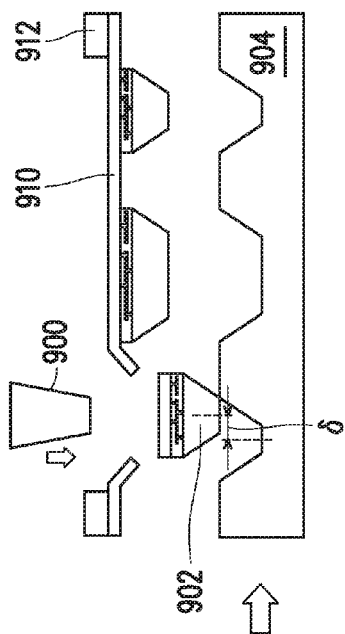
FIGS. 9A-9D illustrate intermediate steps in the formation of an integrated-chiplets wafer in accordance with some embodiments.

FIGS. 9A-9D illustrate intermediate steps in the placement of a chiplet 902 into a recess 906 according to an embodiment. The chiplet 902 and recess 906 may be similar to chiplets and recesses described previously herein (e.g., chiplet 102 and recess 108 shown in FIGS. 1A-1B). FIG. 9A shows multiple chiplets attached to a supporting layer 910. In some embodiments the supporting layer 910 may be a layer similar to supporting layer 610 as described in FIGS. 6A-6D, and in some embodiments the supporting layer 910 may be a different type of layer, film, or carrier. The supporting layer 910 is held by a frame 912, and the supporting layer 910 is positioned such that at least one chiplet is approximately aligned above a corresponding recess in a substrate 904. For example, chiplet 902 is aligned approximately above the recess 906. As FIG. 9A shows, a tool 900 moves down toward the chiplet 902. Tool 900 may be a pick-and-place tool, tool head, or the like, and may use vacuum suction to hold a chiplet. In some embodiments, the tool 900 may use force-feedback during chiplet placement.

Figure 9B:
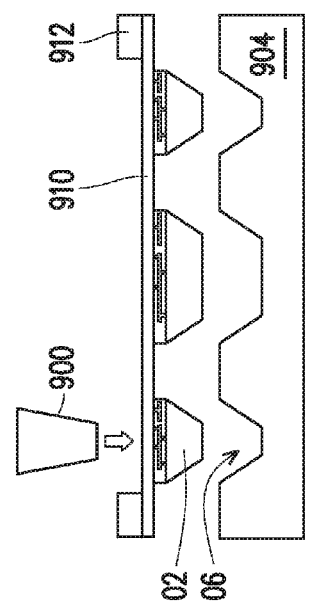
Figure 9C:
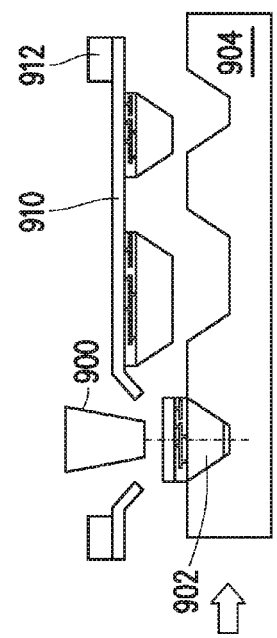

In FIG. 9B, the tool 900 has moved down, pushing chiplet 902 such that a portion of the supporting layer 910 that supports chiplet 902 breaks, detaching chiplet 902. The other chiplets remain attached to the supporting layer 910. In some cases, the tool 900 may use a vacuum to hold the chiplet 902. The chiplet 902 may be misaligned with respect to the recess 906 within the particular misalignment tolerance of the chiplet 902 and the recess 906, as shown in FIG. 9B. In FIG. 9C, the tool 900 has moved the chiplet 902 into the recess 906. If the chiplet 902 is misaligned to the recess 906, the chiplet 902 will self-align to the recess 906 as it enters the recess 906. In some cases, the tool 900 temporarily holds the chiplet 902 with a vacuum and the vacuum is released when the chiplet 902 has entered the recess 906.

Figure 9D:
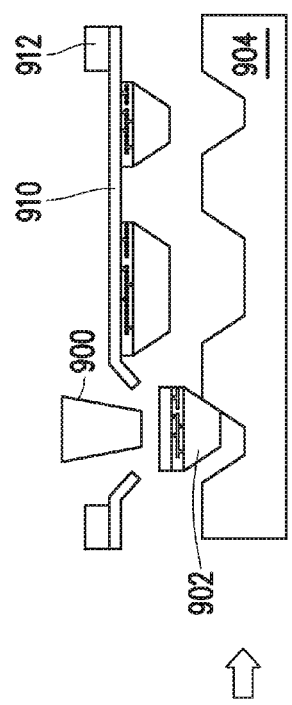

In FIG. 9D, the chiplet 902 has been fully placed within the recess 906. Due to self-aligning, the misalignment of the placed chiplet 902 may be about zero. After the chiplet 902 is placed, the tool 900 may release its vacuum and move to another chiplet to repeat the placement process. The portion of the supporting layer 910 that remains on the chiplet 902 may be removed in a subsequent step by etching, grinding, CMP, or another technique.

FIGS. 10A-10D illustrate intermediate steps in the placement of a chiplet 902 into a recess 906 according to an embodiment. FIG. 10A shows multiple chiplets attached to a film 1010. In some embodiments the film 1010 may be a film, tape, or other carrier similar to supporting layer 710 as described in FIGS. 7A-7E, and in some embodiments the film 1010 may be a different type of film, tape, or carrier. The film 1010 is held by a frame 1012, and the film 1010 is positioned such that at least one chiplet is approximately aligned above a corresponding recess in a substrate 904. For example, chiplet 902 is aligned approximately above the recess 906. As FIG. 10A shows, a tool 900 moves down toward the chiplet 902.

In FIG. 10B, the tool 900 has moved down, pushing chiplet 902 such that a portion of the film 1010 that supports chiplet 902 bends or stretches downward. The other chiplets remain attached to the film 1010. In FIG. 10C, the tool 900 has moved the chiplet 902 into the recess 906, further bending or stretching the film 1010. If the chiplet 902 is misaligned to the recess 906, the chiplet 902 will self-align to the recess 906 as it enters the recess 906.

In FIG. 10D, the chiplet 902 has detached from the film 1010 and the tool 900 has been withdrawn. In some cases, the chiplet 902 detaches from the film 1010 before the tool 900 has been withdrawn, and in other cases, the chiplet 902 detaches from the film 1010 as the tool 900 is withdrawn. In some cases, the bent or stretched portion of the film 1010 retracts toward its original position, as shown in FIG. 10D.

In some cases, the tool 900 pushes the chiplet 902 mostly or fully into the recess 906, and in other cases the tool 900 withdraws before the chiplet 902 is mostly or fully placed within the recess 906. Once detached from the film 1010, the chiplet 902 moves downward into the recess 906 until it is seated within the recess 906. Due to self-aligning, the misalignment of the placed chiplet 902 may be about zero. After the chiplet 902 is placed, the tool 900 may move to another chiplet to repeat the placement process.

FIGS. 11A-11D illustrate intermediate steps in the placement of a chiplet 902 into a recess 906 according to an embodiment. FIG. 11A shows a tool 900 holding chiplet 902 by a vacuum, having previously picked up chiplet 902. The tool 900 is positioned such that the chiplet 902 is aligned approximately above the recess 906. As FIG. 11A shows, a tool 900 moves down toward the chiplet 902. In FIG. 11B, the tool 900 has moved down, pushing chiplet 902 toward the recess 906. In FIG. 10C, the tool 900 has moved the chiplet 902 partly into the recess 906. While the chiplet 902 is partly placed within the recess 906, the tool 900 may release its vacuum and move to another chiplet to repeat the placement process. If the chiplet 902 is misaligned to the recess 906, the chiplet 902 will self-align to the recess 906 as it enters the recess 906. Once released from the tool 900, the chiplet 902 moves downward into the recess 906 until it is seated within the recess 906. In FIG. 11D, the chiplet 902 has been fully placed within the recess 906. Due to self-aligning, the misalignment of the placed chiplet 902 may be about zero.

FIGS. 12A-12C illustrate intermediate steps in an integrated-chiplets manufacture process according to an embodiment. FIG. 12A shows a portion of an integrated-chiplets wafer 1200. The integrated-chiplets wafer 1200 may be similar to integrated-chiplets wafers described previously herein (e.g., integrated-chiplets wafer 200 shown in FIGS. 2A-2C). In FIG. 12A, chiplets 1202 have been placed within their respective recesses on substrate 1204. The chiplets 1202 shown in FIGS. 12A-12C each have chiplet metallization layers, and an example chiplet metallization layer 1212 is labeled in FIG. 12A. In other cases, some, all, or none of the chiplets 1202 may have a chiplet metallization layer. In an optional step, a leveling tool head 1210 presses on the chiplets 102 to level the chiplets 102 and ensure the chiplets 102 are securely placed within their respective recesses. In some cases, the leveling tool head 1210 may press on a chiplet metallization layer or press directly on a chiplet if no chiplet metallization layer is present. The leveling tool head 1210 may level chiplets 102 individually or simultaneously level a group of chiplets 102 as shown in FIG. 12A. The leveling tool head 1210 may simultaneously level chiplets 102 across an entire wafer, a single die, a group of dies, or across another region or group.

In FIG. 12B, all chiplets 1202 are simultaneously bonded. As described previously, the chiplets 1202 may be bonded to the substrate 1204 using a direct bond, an intermediate bonding material, or another bonding technique as described previously. In some cases, the intermediate bonding material is deposited within a recess before the chiplet is placed. The bonding process may include applying a thermal process to the entire integrated-chiplets wafer 1200 such as a bake, cure, anneal, or other thermal process. In FIG. 12C, and RDL 1220 is formed over the chiplets 1202 and substrate 1204.

Figures 13A, 13B:
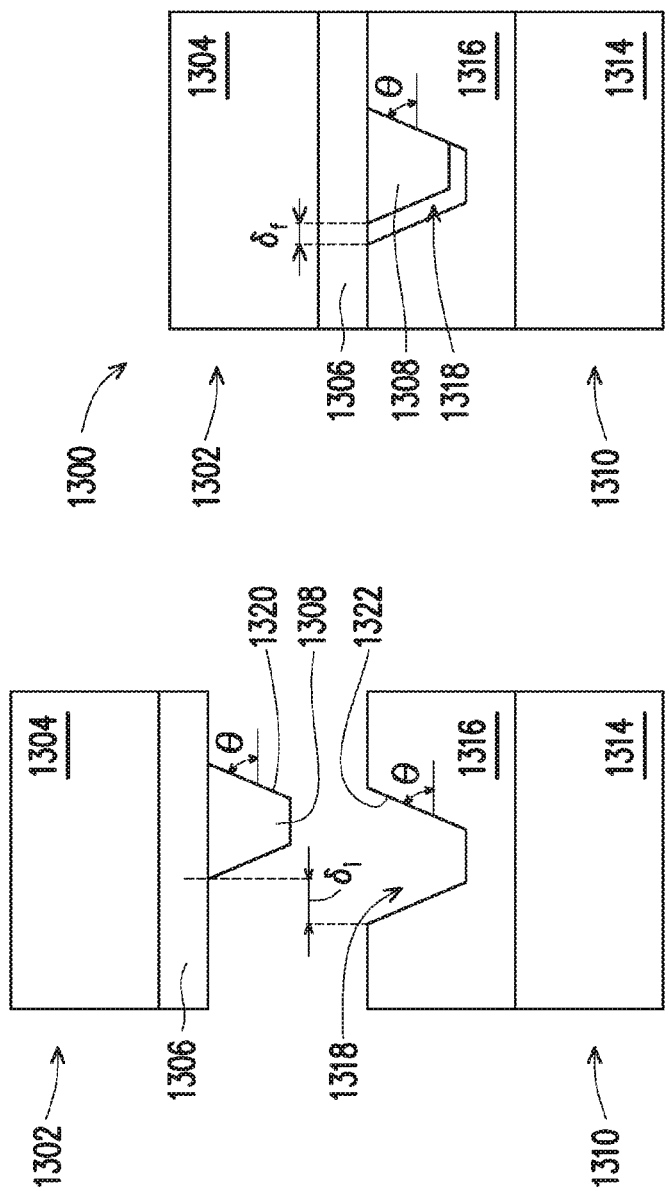
FIGS. 13A-13C illustrate intermediate steps in the formation of a bonded chiplet structure in accordance with some embodiments.

FIG. 13A and FIG. 13B illustrate aspects of forming a bonded chiplet structure 1300 in accordance with some embodiments. FIG. 13A shows an example top wafer 1302 that includes a substrate 1304, optional dielectric layer 1306, and a chiplet 1308. In some embodiments, the top wafer 1302 may be a wafer, a chip, an integrated circuit die, a semiconductor device, a memory chip, an interconnect structure, another type of device, or the like. The optional dielectric layer 1306 may be one or more dielectric layers, one or more metallization layers, an RDL, an interconnect layer, a passivation layer, or other type of layer. The optional dielectric layer 1306 may include one or more layers of $SiO_2$ or another type of oxide, SiN, a polymer, or another material. In some embodiments, the top wafer 1302 includes one or more integrated chiplets, such integrated-chiplets wafer 200 shown in FIGS. 2A-C or elsewhere in this disclosure.

The chiplet 1308 is formed on the surface of the optional dielectric layer 1306. In some embodiments, the chiplet 1308 is formed on the surface of the substrate 1304. The chiplet 1308 may be formed from a semiconductor material or one or more dielectric materials such as $SiO_2$, SiN, a polymer, or another dielectric material. The chiplet 1308 may contain interconnects, contact pads, through vias, or other conductive features. The chiplet 1308 may be formed using any suitable methods or manufacturing techniques as known in the art. Some embodiments of forming the chiplet 1308 are described below with respect to FIGS. 16A-16B.

The chiplet 1308 may have similar size or shape as the other chiplets described above, such as chiplet 102. The chiplet 1308 may have square shape in plan view, a rectangular shape in plan view, a cross shape in plan view, or another shape in plan view. In some cases, the chiplet 1308 may have a length in plan view of about 0.4 μm or greater, such as about 1 μm, 2 μm, 10 μm, 100 μm, or another length. In some cases, the chiplet 1308 has a thickness of about 0.8 μm or greater, such as about 1 μm, 2 μm, 10 μm, 100 μm, or another thickness.

In some embodiments, the substrate 1304 may be a wafer made of glass, silicon (e.g., a silicon wafer) or another semiconductor material, silicon oxide or other dielectric material, an SOI wafer, the like, or another type of substrate. In some embodiments, the substrate 1304 may made of metal, a ceramic material, a plastic or other polymer material, a combination, or the like. The substrate 1304 may be a device wafer, an interposer, die, or integrated circuit, and may include active or passive devices, metallization layers, passivation layers, vias, a combination, or the like. The substrate 1304 may also be a carrier, blank carrier wafer, boat, frame, package, or the like.

FIG. 13A also shows an example bottom wafer 1310 that includes a substrate 1314, a dielectric layer 1316, and a recess 1318. In some embodiments, the bottom wafer 1310 may be a wafer, a chip, an integrated circuit die, a semiconductor device, a memory chip, an interconnect structure, another type of device, or the like. The dielectric layer 1316 may include one or more dielectric layers, one or more metallization layers, an RDL, an interconnect layer, a passivation layer, or other type of layer. The dielectric layer 1316 may include one or more layers of $SiO_2$, SiN, another type of oxide, a polymer, or another material. In some embodiments, the bottom wafer 1310 includes one or more integrated chiplets, such integrated-chiplets wafer 200 shown in FIGS. 2A-C or elsewhere in this disclosure.

The recess 1318 is formed in the surface of the dielectric layer 1316, and is shaped to receive the chiplet 1308. The recess 1318 may extend completely through the dielectric layer 1316 or extend partially through the dielectric layer 1316 as shown in FIG. 13A. The recess 1318 may be formed using any suitable methods or manufacturing techniques as known in the art. Some embodiments of forming the recess 1318 are described below with respect to FIGS. 17A-17B. In some embodiments, the recess 1318 is formed in the substrate 1314, and some or all of the dielectric layer 1316 is not present.

In some embodiments, the recess 1318 may have similar size or shape as the other recesses described herein, such as recess 108 shown in FIG. 1A. In some embodiments, the recess 1318 may have square shape in plan view, a rectangular shape in plan view, a cross shape in plan view, or another shape in plan view. In some embodiments, the recess 1318 may have a length in plan view of about 0.4 μm or greater, such as about 1 μm, 2 μm, 10 μm, 100 μm, or another length. In some embodiments, the recess 1318 has a depth of about 0.8 μm or greater, such as about 1 μm, 2 μm, 10 μm, 100 μm, or another depth.

FIG. 13B shows the top wafer 1302 bonded to the bottom wafer 1312 to form the bonded chiplet structure 1300. In the bonded chiplet structure 1300, the chiplet 1308 placed into the recess 1318. In some embodiments, the depth of the recess 1318 is greater than a thickness of the chiplet 1308 such that a gap is present between a bottom surface of the chiplet 1308 and a bottom surface of the recess 1318. In this manner, effects due to variations in the thickness of the chiplet 1308 or the depth of the recess 1318 may be reduced. In some embodiments, the chiplet 1308 and the recess 1318 may be immersed in water during placement to facilitate self-alignment, described in greater detail below.

After the top wafer 1302 and the bottom wafer 1312 are brought together such that chiplet 1308 is placed within the recess 1318, the top wafer 1302 may be bonded to the bottom wafer 1312. In some embodiments, the chiplet 1308 is bonded to a sidewall of the recess 1318. In some embodiments, the dielectric layer 1306 is bonded to the dielectric layer 1316. In some embodiments, the bonding process is a direct bonding process, a hybrid bonding process, or another bonding process. For example, the bonding process may form a SiO—SiO bond, a metal-metal bond, or another type of bond. The bonding process may include, for example, surface preparation steps, one or more anneals, water immersion, or other techniques as known in the art.

In some embodiments, a sidewall 1320 of the chiplet 1308 and a corresponding sidewall 1322 of the recess 1318 may have a similar shape or have a similar profile. More than one chiplet sidewall 1320 and more than one recess sidewall 1322 may have corresponding shapes or profiles. In this manner, some, most, or all of the area of chiplet sidewalls 1320 and recess sidewalls 1322 may be physically contacting. For example, in the illustrative embodiments shown in FIG. 13A, the chiplet sidewall 1320 is substantially planar and has an angle of θ, and the recess sidewalls 1322 are also substantially planar with an angle of θ. Thus, as shown in FIG. 13B, when the chiplet 1308 is placed in the recess 1318, the similarly angled sidewalls allow portions of the chiplet sidewall 1320 to be parallel with and physically contact portions of the recess sidewalls 1322. This is similar to the behavior of chiplets and recesses discussed previously, for example those shown in FIGS. 1A-1B. Having similarly-shaped sidewalls may allow more contacting surface area between the chiplet 1308 and the recess 1318, which may improve bonding between the chiplet 1308 and the recess 1318. Moreover, having similar sidewalls may also allow improved alignment of the chiplet 1308 within the recess 1318 and thus improved alignment of the top wafer 1302 to the bottom wafer 1312, described in greater detail below.

In some embodiments, the sidewalls of a chiplet or a recess may not be straight or planar as shown in FIGS. 13A-13B. The chiplet may have one or more sidewalls with a substantially constant sidewall angle. In other embodiments, some or all of the sidewalls may be curved, different portions of the sidewalls may have different angles, or the sidewalls may have an irregular shape. In some cases, the sidewalls of the chiplet or of the recess are symmetric. In some cases, different sidewalls of a chiplet may have different shapes and different sidewalls of a recess may have different shapes.

In some cases, the chiplet 1308 and recess 1318 as describe herein may allow self-alignment of the top wafer 1302 to the bottom wafer 1312. The chiplet 1308 and recess 1318 as described herein may also allow the top wafer 1302 and the bottom wafer 1312 to reduce misalignment due to imprecision of an aligning tool used to align the top wafer 1302 to the bottom wafer 1312. For example, in FIG. 13A, the chiplet sidewalls 1320 are angled inward toward the bottom of the chiplet 1308, and the recess sidewalls 1322 shown in FIG. 13A are angled inward toward the bottom of the recess 1318. During alignment of the top wafer 1302, if the top wafer 1302 is not precisely aligned to the bottom wafer 1310, the chiplet sidewall 1320 will impinge on and slide against the recess sidewall 1322 as the chiplet 1308 moves down into the recess 1318. The similar angles of the chiplet sidewall 1320 and recess sidewall 1322 cause the chiplet 1308 to shift laterally toward a more aligned position as the chiplet 1308 moves down into the recess 1318. The chiplet 1308 may move down into the recess 1318 until the bottom surface of the top wafer 1302 (excluding the chiplet 1308) contacts the top surface of the bottom wafer 1310. In this manner, the top wafer 1302 may self-align to the bottom wafer 1310. In some cases, the chiplet 1308 may self-align if at least the bottom of a chiplet sidewall 1320 is over at least the top of a recess sidewall 1322. This self-aligning action is similar to that described above with respect to the embodiment shown in FIGS. 1A-1B.

Figure 13C:
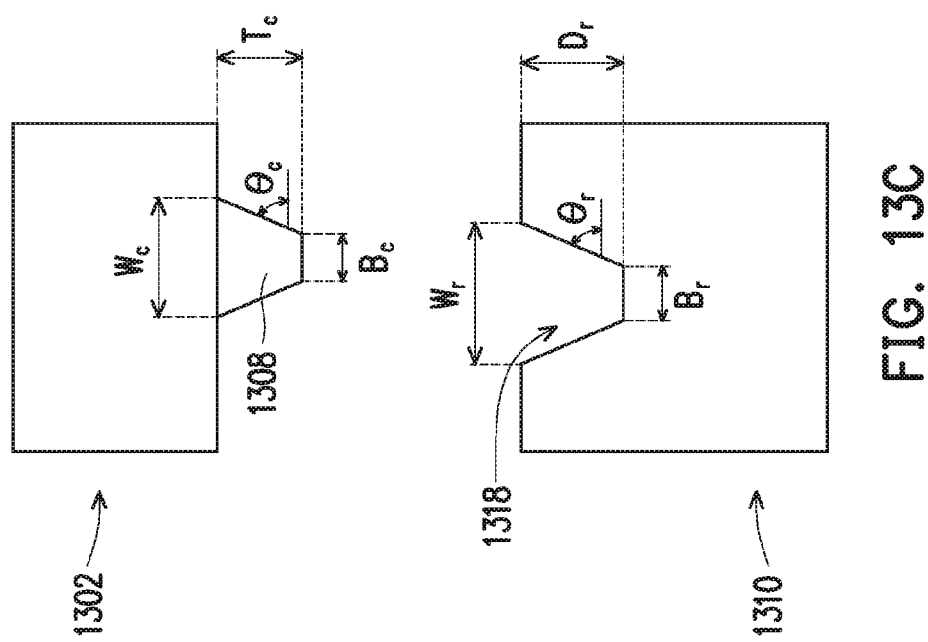

In an example shown in FIGS. 13A-13B, an initial misalignment of $\delta_i$ during alignment may be reduced to a final misalignment of $\delta_f$, where $\delta_i > \delta_f$. In this manner, the final misalignment may be about $\delta_f$ or less even if the alignment tolerance or the imprecision of the aligning tool is greater than $\delta_f$. In some embodiments, the final misalignment $\delta_f$ may be 0.1 μm, 0.2 μm, 0.5 μm, 1.0 μm, or another distance. FIG. 13C illustrates a cross-section of top wafer 1302 and bottom wafer 1310 with dimensions of the chiplet 1308 and recess 1318 labeled. The label dimensions in FIG. 13C are example dimensions that can be controlled or specified to configure the size and shape of the chiplet 1308 and recess 1318. Other dimensions or characteristics that are not labeled may also be controlled, such as the length of the chiplet 1308 or the length of the recess 1318 that is perpendicular to the cross-section. In the illustrative example shown in FIG. 13C, chiplet 1308 has a top width $W_c$, a bottom width $B_c$, a thickness $T_c$, and a sidewall angle $\theta_c$. Recess 1318 has a top width $W_r$, a bottom width $B_r$, a depth $D_r$, and a sidewall angle $\theta_r$. In some embodiments, the maximum initial misalignment $\theta_i$ of the chiplet 1308 and the recess 1318 that still allows self-alignment of the chiplet 1308 and the recess 1318 is given by $\delta_i = (W_r - B_c)$. In some cases $B_c$ and $W_r$ may be configured so that this maximum initial misalignment $\delta_i = (W_r - B_c)$ is greater than or equal to the expected imprecision of the alignment tool. In this manner, the chiplet 1308 may be able to self-align to the recess 1318 despite expected misalignment due to the alignment tool. In some embodiments, the final misalignment $\delta_f$ may be predetermined, and then $W_r$ and/or $W_c$ may be determined from $\delta_f = (W_r - W_c)$, and $B_r$ and/or $B_c$ may be determined from $\delta_f = (B_r - B_c)$. As another illustrative example, if $B_c$, $T_c$, and the sidewall angle $\theta_c$ of a chiplet 1308 are known, the top width $W_c$ can be determined from the expression $W_c = B_c + 2T_c/\tan(\theta_c)$. In this manner, the chiplet 1308 and the recess 1318 may be formed with certain dimensions to accommodate a known imprecision of a specific alignment tool, process specifications, design limitations, or other factors.

Thus, the self-aligning behavior of the chiplet 1308 and recess 1318 may allow both an increased tolerance to misalignment during initial alignment and a reduced final misalignment. The misalignment tolerance for other chiplets, recesses, and embodiments depends on factors such as the angle or shape of the chiplet sidewalls and recess sidewalls, the thickness and size of the chiplet, and the depth and size of the recess. A larger misalignment tolerance may enable faster alignment, as the alignment tool may not require as much time to precisely align the substrate with the chiplet to the substrate with the corresponding recess.

Figure 14A:
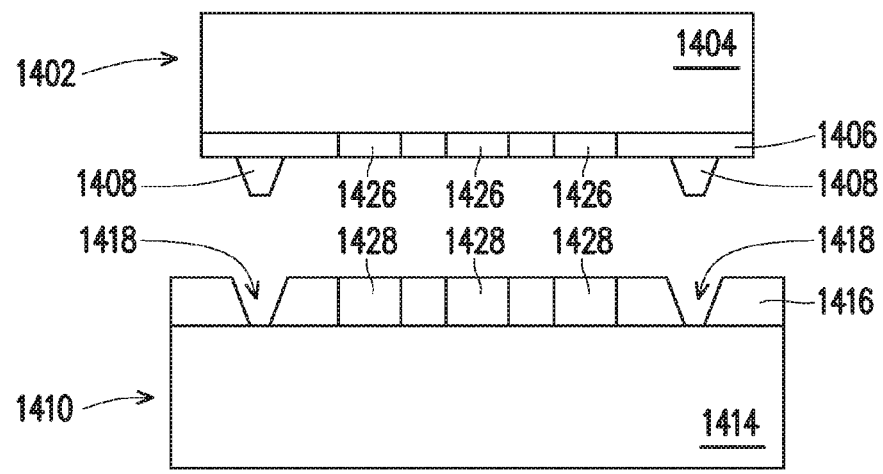
FIGS. 14A-14B illustrate intermediate steps in the formation of a stacked wafer structure in accordance with some embodiments.
Figure 14B:
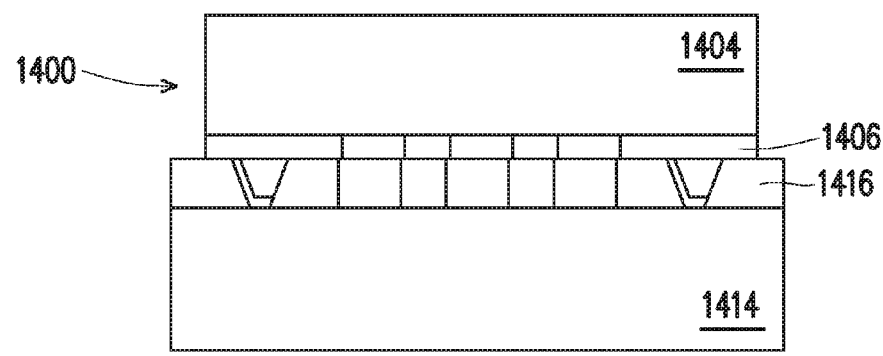

FIG. 14A and FIG. 14B illustrate aspects of forming a stacked wafer structure 1400 in accordance with some embodiments. FIG. 14A shows a cross-section of an example top wafer 1402 to be bonded to an example bottom wafer 1410 to form stacked wafer structure 1400. The top wafer 1402 includes a substrate 1404, dielectric layer 1406 with contact pads 1426, and chiplets 1408. The bottom wafer 1410 includes a substrate 1414, dielectric layer 1416 with contact pads 1428, and recesses 1418. The top wafer 1402 or bottom wafer 1410 may be similar to other wafers described herein, such as top wafer 1302 or bottom wafer 1310 described above. The top wafer 1402 or bottom wafer 1410 may include layers, structures, or features not shown in FIGS. 14A-14B. The contact pads 1426 and the contact pads 1428 as shown in FIGS. 14A-14B are illustrative examples and in some embodiments may not extend completely through the dielectric layer 1406 or the dielectric layer 1416, respectively. In some embodiments, the contact pads 1426 or the contact pads 1428 may be part of or be electrically connected to an RDL, a metallization layer, a via, active or passive device, interposer, or other conductive feature or layer. The chiplets 1408 or recesses 1418 may be similar to the chiplets 1308 or recesses 1318 described previously. Other embodiments include other numbers, shapes, or arrangements of chiplets 1408 or recesses 1418.

FIG. 14B illustrates an example cross-section of the top wafer 1402 bonded to the bottom wafer 1410 to form stacked wafer structure 1400. The top wafer 1402 has been aligned to the bottom wafer 1410, and the chiplets 1408 have been placed into their corresponding recesses 1418. The self-aligning behavior of the chiplets 1408 and recesses 1418 may or may not have been used during alignment. In some embodiments, the stacked wafer structure 1400 is singulated after bonding. The top wafer 1402 may be bonded to the bottom wafer 1410 using direct bonding, dielectric bonding, metal bonding, hybrid bonding, or another bonding technique. In some embodiments, the dielectric layer 1406 may be bonded to the dielectric layer 1416. Moreover, the contact pads 1426 on the top wafer 1402 may be bonded to the contact pads 1428 on the bottom wafer 1410 to form interconnections between both wafers. In this manner, the top wafer 1402 and the bottom wafer 1410 may be electrically connected and form interconnections between devices or structures present in or on the top wafer 1402 and the bottom wafer 1410.

Figure 15A:
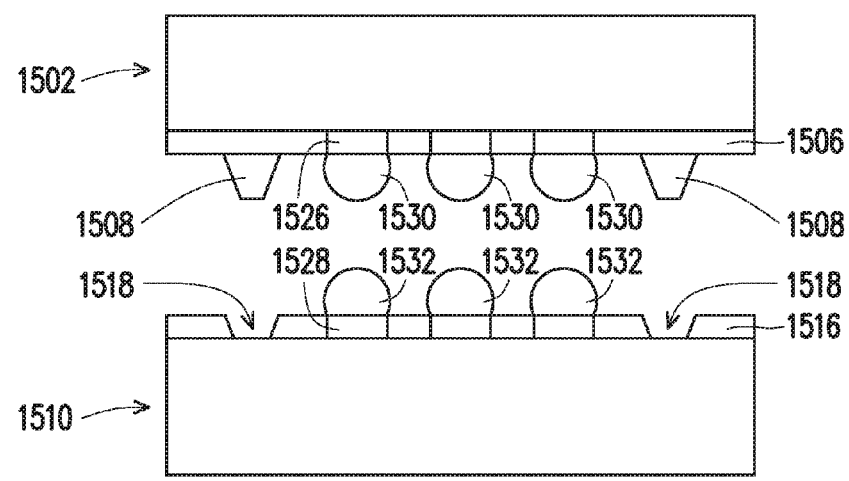
FIGS. 15A-15B illustrate intermediate steps in the formation of a stacked wafer structure in accordance with some embodiments.
Figure 15B:
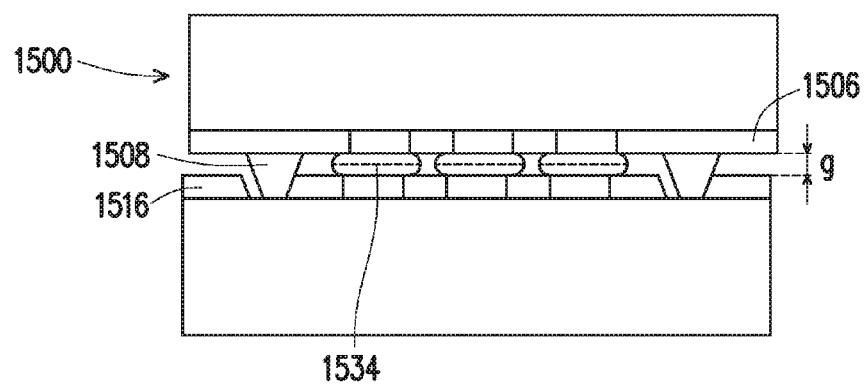

FIG. 15A and FIG. 15B illustrate aspects of forming a stacked wafer structure 1500 in accordance with some embodiments. FIG. 15A shows a cross-section of an example top wafer 1502 to be bonded to an example bottom wafer 1510 to form stacked wafer structure 1500. The top wafer 1502 includes a dielectric layer 1506 with contact pads 1526, conductive connectors 1530, and chiplets 1508. The bottom wafer 1510 includes a dielectric layer 1516 with contact pads 1528, conductive connectors 1532, and recesses 1518. The top wafer 1502 or bottom wafer 1510 may be similar to other wafers described herein, such as top wafer 1302 or bottom wafer 1310 described above. The top wafer 1502 or bottom wafer 1510 may include layers, structures, or features not shown in FIGS. 15A-15B.

Referring to FIGS. 15A-15B, the conductive connectors 1530 are formed on the contact pads 1526 and the conductive connectors 1532 are formed on the contact pads 1528. In some embodiments, the contact pads 1526 or the contact pads 1528 may be Under-Bump Metallizations (UBMs). The conductive connectors 1530 or the conductive connectors 1532 may be BGA connectors, solder balls, metal pillars, controlled collapse chip connection (C4) bumps, micro bumps, electroless nickel-electroless palladium-immersion gold technique (ENEPIG) formed bumps, or the like. The conductive connectors 1530 or the conductive connectors 1532 may include a conductive material such as solder, copper, aluminum, gold, nickel, silver, palladium, tin, the like, or a combination thereof. In some embodiments, the conductive connectors 1530 or the conductive connectors 1532 are formed by initially forming a layer of solder through such commonly used methods such as evaporation, electroplating, printing solder transfer, ball placement, or the like. Once a layer of solder has been formed on the structure, a reflow may be performed in order to shape the material into the desired bump shapes. In another embodiment, the conductive connectors 1530 or the conductive connectors 1532 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar conductive connectors 1530 or the metal pillar conductive connectors 1532. The metal cap layer may include nickel, tin, tin-lead, gold, silver, palladium, indium, nickel-palladium-gold, nickel-gold, the like, or a combination thereof and may be formed by a plating process. In some embodiments, the conductive connectors 1530 or the conductive connectors 1532 are present.

FIG. 15B illustrates an example cross-section of the top wafer 1502 bonded to the bottom wafer 1510 to form stacked wafer structure 1500. The top wafer 1502 has been aligned to the bottom wafer 1510, and the chiplets 1508 have been placed into their corresponding recesses 1518. The self-aligning behavior of the chiplets 1508 and recesses 1518 may or may not have been used during alignment. In some embodiments, the stacked wafer structure 1500 is singulated after bonding. The conductive connectors 1530 of the top wafer 1502 may be bonded to the conductive connectors 1532 of the bottom wafer 1510 to form interconnections 1534 between both wafers. In an embodiment, the top wafer 1502 is bonded to the bottom wafer 1510 by a reflow process. During this reflow process, the conductive connectors 1530 are in contact with the conductive connectors 1532 and the metallization patterns 106 to physically and electrically couple the top wafer 1502 to the bottom wafer 1510. In some embodiments, the conductive connectors 1530 or the conductive connectors 1532 are present, and the conductive connectors on one wafer are bonded to the contact pads of the opposite wafer. In some embodiments, an underfill (not shown) may be formed between the top wafer 1502 and the bottom wafer 1510 and surrounding the conductive connectors 1530, conductive connectors 1532, or the chiplets 1508.

In the embodiment shown in FIGS. 15A-15B, the thickness ($T_c$) of the chiplets 1508 is greater than the depth ($D_r$) of the recesses 1518 such that a gap g is present between the top wafer 1502 and the bottom wafer 1510. The gap g may be determined approximately from $g=(T_c-D_r)$. The gap g allows a space for the conductive connectors 1530 and the conductive connectors 1532 to reflow or bond. In some cases, the thickness ($T_c$) of the chiplets 1508 and the depth ($D_r$) of the recesses 1518 may be configured to determine a specific height of gap g. Thus, the height of gap g may be adjusted, for example, to optimize or otherwise adjust the characteristics of the bonding of the conductive connectors 1530 or the conductive connectors 1532.

Figure 16A:
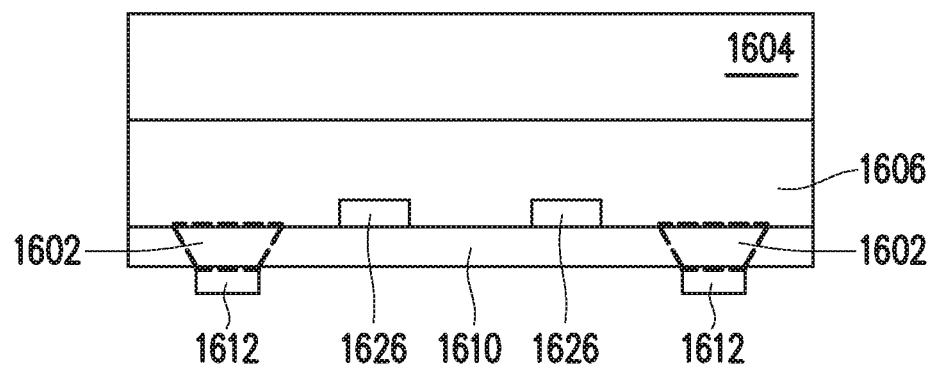
FIGS. 16A-16B illustrate intermediate steps in the formation of chiplets in accordance with some embodiments.

FIGS. 16A-16D illustrate intermediate steps in the formation of chiplets 1608 according to an embodiment. The individual chiplets 1608 may be the same or be different devices or different types of chiplets as described previously (e.g., chiplet 1308 shown in FIGS. 13A-13C). FIG. 16A shows an example substrate 1604, a first dielectric layer 1606 with contact pads 1626, and a second dielectric layer 1610 with chiplet regions 1602. The chiplet regions 1602 indicate where chiplets 1608 are to be formed from the substrate 604. The example substrate 1604 may be a semiconductor substrate, a wafer, an integrated circuit die, or another type of substrate as described previously. The first dielectric layer 1606 or the second dielectric layer 1610 may be similar to the dielectric layer 1316 shown in FIGS. 13A-13C, or similar to other dielectric layers described previously. In some embodiments, the second dielectric layer 1610 is part of the first dielectric layer 1606.

Figure 16B:
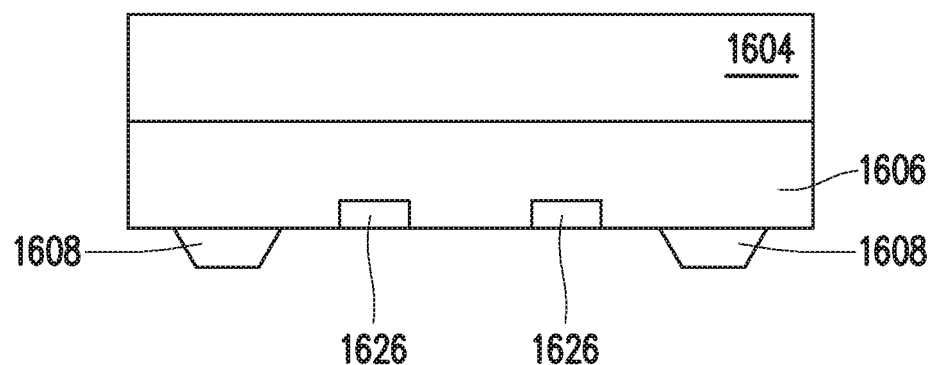

FIG. 16B shows the second dielectric layer 1610 with a mask 1612 disposed on its surface. The mask 1612 has been patterned to protect the chiplet regions 1602 during a subsequent etch step. The mask 1612 may be, for example, a photoresist or hardmask and may be patterned using any suitable photolithography technique. After the mask 1612 has been patterned, sacrificial portions of the second dielectric layer 1610 are etched to isolate the chiplet regions 1608. Contact pads 1626 may be exposed after removing the sacrificial portions of the second dielectric layer 1610. After etching the sacrificial portions of the second dielectric layer 1610, isolated chiplets 1608 remain. The mask 1612 is removed after the chiplets 1608 have been isolated.

The sacrificial portions of the second dielectric layer 1610 may be removed using any suitable wet or dry etch technique. For example, an RIE etch or other plasma etch process may be used to remove portions of the second dielectric layer 1610. In other embodiments, isotropic etching, dry etching, or combinations of etching techniques may be used to isolate chiplets and shape chiplet sidewalls, including forming chiplet sidewalls having other angles. For example, the angle of the chiplet sidewalls can be controlled by adjusting appropriate parameters of a plasma etch process. In some embodiments, the chiplets 1608 may be formed as part of a back-end-of-line (BEOL) stage of a manufacturing process.

Figure 17A:
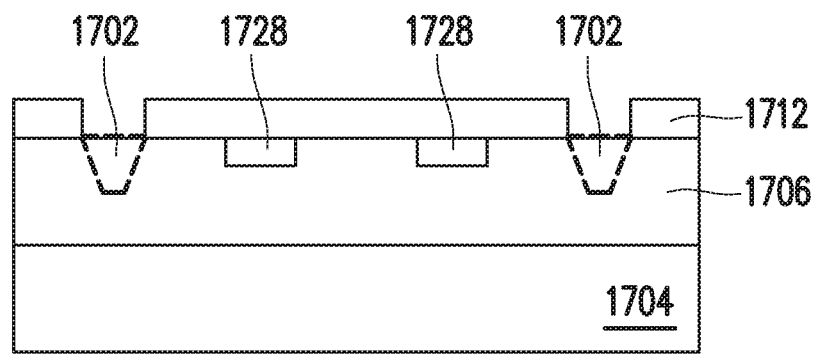
FIGS. 17A-17B illustrate intermediate steps in the formation of recesses in accordance with some embodiments.
Figure 17B:
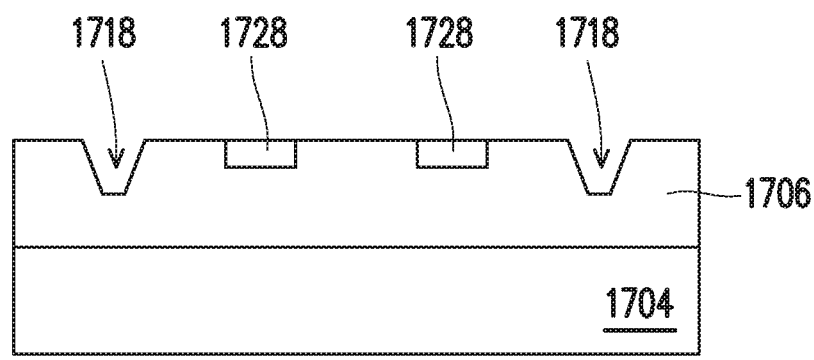

FIGS. 17A-17B illustrate intermediate steps in the formation of recesses 1718 according to an embodiment. The individual recesses 1718 may be similar to recesses described previously herein (e.g., recess 1318 shown in FIGS. 13A-13B). FIG. 17A shows an example substrate 1704 and a dielectric layer 1706 with contact pads 1728 and recess regions 1702. The recess regions 1702 indicate where recesses 1718 are to be formed in the dielectric layer 1706.

The example substrate 1704 may be a semiconductor substrate, a wafer, an integrated circuit die, or another type of substrate as described previously. The dielectric layer 1706 may be similar to the dielectric layer 1316 shown in FIGS. 13A-13C, or similar to other dielectric layers described previously.

FIG. 17B shows the dielectric layer 1706 with a mask 1712 disposed on its surface. The mask 1712 has been patterned to protect portions of the dielectric layer 1706 adjacent the recess regions 1702 during a subsequent etch step. The mask 1712 may be, for example, a photoresist or hardmask and may be patterned using any suitable photolithography technique. After the mask 1712 has been patterned, the recess regions 1702 of the dielectric layer 1706 are etched to form the recesses 1718. The mask 1612 is removed after the recesses 1718 have been formed.

The recess regions 1702 of the dielectric layer 1706 may be removed using any suitable wet or dry etch technique. For example, an RIE etch or other plasma etch process may be used to remove portions of the dielectric layer 1706. In other embodiments, isotropic etching, dry etching, or combinations of etching techniques may be used to form recesses and shape recess sidewalls, including forming recess sidewalls having other angles. For example, the angle of the recess sidewalls can be controlled by adjusting appropriate parameters of a plasma etch process. In some embodiments, the recesses 1718 may be formed as part of a back-end-of-line (BEOL) stage of a manufacturing process. The recess regions 1702 may be removed using any suitable wet or dry etch technique, including an etch technique similar to the etch technique described above for forming chiplets 1608 shown in FIG. 16B. Forming chiplet sidewalls and recess sidewalls using similar techniques may allow improved chiplet self-alignment and improved chiplet-substrate bonding.

Figure 18A:
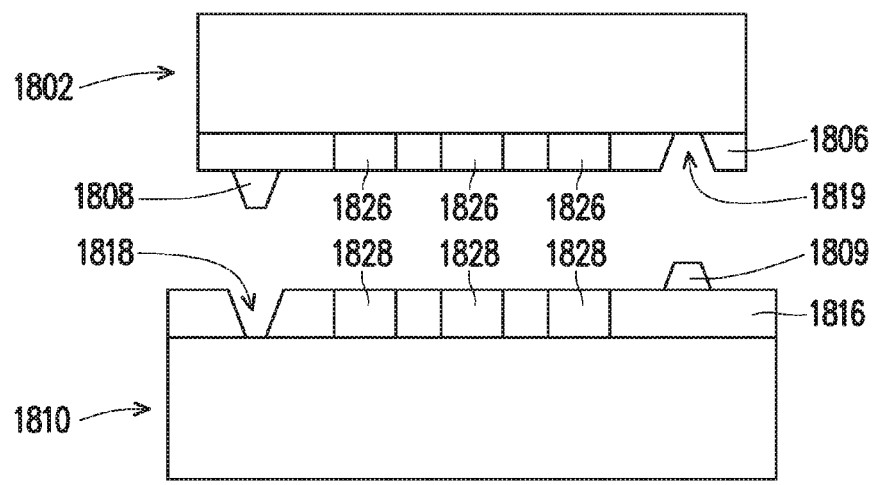
FIGS. 18A-18B illustrate intermediate steps in the formation of a stacked wafer structure in accordance with some embodiments.
Figure 18B:
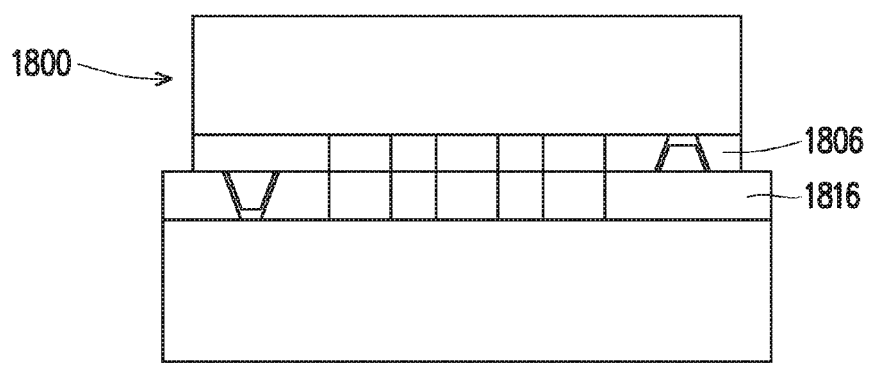

FIG. 18A and FIG. 18B illustrate aspects of forming a stacked wafer structure 1800 in accordance with some embodiments. FIG. 18A shows a cross-section of an example top wafer 1802 to be bonded to an example bottom wafer 1810 to form stacked wafer structure 1800. The top wafer 1802 includes a top dielectric layer 1806 with contact pads 1826. A top chiplet 1808 is disposed on the top dielectric layer 1806, and the top dielectric layer 1806 also includes a top recess 1819. The bottom wafer 1810 includes a bottom dielectric layer 1416 with contact pads 1428. A bottom chiplet 1809 is disposed on the bottom dielectric layer 1816, and the bottom dielectric layer 1816 also includes a bottom recess 1818. The top wafer 1802 or bottom wafer 1810 may be similar to other wafers described herein, such as top wafer 1302 or bottom wafer 1310 described above. The top wafer 1802 or bottom wafer 1810 may include layers, structures, or features not shown in FIGS. 18A-14B. The contact pads 1826 and the contact pads 1828 as shown in FIGS. 18A-18B are illustrative examples and in some embodiments may not extend completely through the dielectric layer 1806 or the dielectric layer 1816, respectively. In some embodiments, the contact pads 1826 or the contact pads 1828 may be part of or be electrically connected to an RDL, a metallization layer, a via, active or passive device, interposer, or other conductive feature or layer. The top chiplet 1808, bottom chiplet 1809, top recess 1819, or bottom recess 1818 may be similar to the chiplets 1308 or recesses 1318 described previously. Other embodiments include other numbers, shapes, or arrangements of chiplets or recesses.

FIG. 18B illustrates an example cross-section of the top wafer 1802 aligned and bonded to the bottom wafer 1810 to form stacked wafer structure 1800. The top chiplet 1808 has been placed into the bottom recess 1818, and the bottom chiplet 1809 has been placed into the top recess 1819. The self-aligning behavior of the chiplets and recesses may or may not have been used during alignment. In some embodiments, the stacked wafer structure 1800 is singulated after bonding. The top wafer 1802 may be bonded to the bottom wafer 1810 using direct bonding, dielectric bonding, metal bonding, hybrid bonding, or another bonding technique. In some embodiments, the dielectric layer 1806 may be bonded to the dielectric 1816. Moreover, the contact pads 1826 on the top wafer 1802 may be bonded to the contact pads 1828 on the bottom wafer 1810 to form interconnections between both wafers. In this manner, the top wafer 1802 and the bottom wafer 1810 may be electrically connected and form interconnections between devices or structures present in or on the top wafer 1802 and the bottom wafer 1810.

Figure 19C:
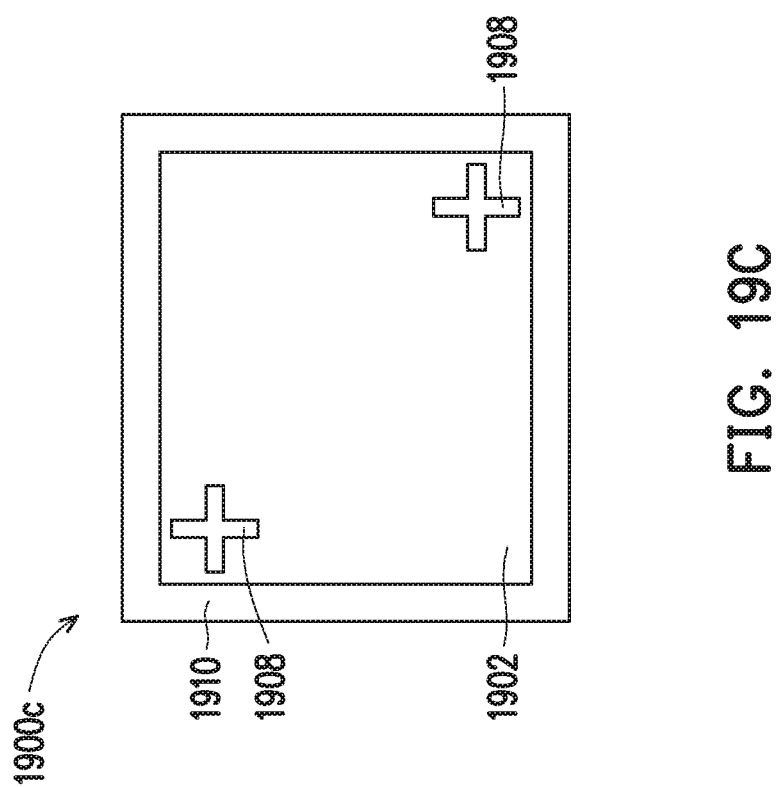

FIGS. 19A-19C illustrate aspects of forming a stacked wafer structures in accordance with some embodiments. FIGS. 19A-19C show a plan view of a portion of an example top wafer 1902 bonded to an example bottom wafer 1910 to form stacked wafer structures 1900*a-c*, respectively. The top wafer 1902 or bottom wafer 1910 may be similar to other wafers described herein, such as top wafers or bottom wafers described previously in FIGS. 13A-18A. FIGS. 19A-19C also show example chiplet regions 1908, in which a chiplet and its corresponding recess may be located on the top wafer 1902 and/or bottom wafer 1910. The chiplet or recess of a chiplet region 1908 may be similar to chiplets or recesses described previously in FIGS. 13A-18A.

FIG. 19A shows an example stacked wafer structure 1900*a* having four rectangular chiplet regions 1908. In some cases, using rectangular chiplet regions 1908, particularly those with a relatively long dimension as shown in FIG. 19A, can improve the final angular alignment of top wafer 1902 to bottom wafer 1910. Separating the chiplet regions 1908 can also improve the final angular alignment. FIG. 19A shows an example stacked wafer structure 1900*b* having an arrangement of multiple chiplet regions 1908. In some embodiments, the chiplet regions 1908 may be distributed to maximize the active areas of the top wafer 1902 and/or the bottom wafer 1910. The chiplet regions 1908 may, for example, have an asymmetric distribution and/or have irregular sizes or shapes. FIG. 19C shows an example stacked wafer structure 1900*c* having cross-shaped chiplet regions 1908. In some cases, chiplet regions 1908 may be shaped to facilitate alignment along more than one axis, such as the cross-shape shown in FIG. 19C. In some embodiments, the chiplet regions 1908 may be shaped in configurations such ring-shaped, T-shaped, H-shaped, hash-mark-shaped, have multiple "branches" in one or more directions, or be shaped in other configurations. In some embodiments, one or more chiplet regions 1908 may be located in a scribe line region, which may help conserve active area. Other embodiments include other numbers, shapes, or arrangements of chiplets or recesses.

Embodiments of the present disclosure may achieve advantages, such as self-aligning allowing increased misalignment tolerance during chiplet placement as well as near-zero misalignment after chiplet placement. Multiple chiplets of different types may be integrated into a single substrate, including chiplets made using different process technologies, made from different semiconductors, having different shapes and sizes, or other different properties. In this manner, heterogeneous chiplet integration may be achieved. Integrated-chiplets dies that are bonded together may have similar areas, reducing an area penalty due to area mismatch. Metallization layers may be formed over chiplets using a BEOL process, reducing the number of steps or layers needed during a subsequent packaging process. In some cases, the use of an integrated-chiplets die may reduce or eliminate the need for an interposer or TSV in a package. Chiplets may also be tested before integration on a wafer, allowing for KGD near 100%. Embodiments of the present disclosure may achieve other advantages, such as self-aligning allowing increased misalignment tolerance and decreased final misalignment during wafer-to-wafer, chip-to-wafer, or chip-to-chip alignment.

According to an embodiment, a method includes forming a first recess in a first substrate, wherein a first area of an opening of the first recess is larger than a second area of a bottom of the first recess, and forming a first device, wherein a third area of a top end of the first device is larger than a fourth area of a bottom end of the first device. The method also includes placing the first device into the first recess, wherein the bottom end of the first device faces the bottom of the first recess, and bonding a sidewall of the first device to a sidewall of the first recess.

According to another embodiment, a method includes inserting a device at least partially into a recess formed in a top surface of a substrate, wherein the device has a tapered profile, and wherein the inserting causes a translation of the device both laterally and toward a bottom surface of the substrate.

According to another embodiment, a semiconductor device includes a substrate that includes multiple recesses in a top surface of the substrate and multiple chiplets disposed respectively in the multiple recesses, wherein the multiple chiplets are bonded to the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first recess in a first substrate, wherein a first area of an opening of the first recess is larger than a second area of a bottom of the first recess, wherein the first recess has a slanted sidewall that extends continuously from the opening of the first recess to the bottom of the first recess;
   forming a first device, wherein a third area of a top end of the first device is larger than a fourth area of a bottom end of the first device;
   placing the first device into the first recess, wherein the bottom end of the first device faces the bottom of the first recess, wherein after the first device is placed into the first recess, the bottom end of the first device is spaced apart from the bottom of the first recess; and
   bonding a sidewall of the first device to a sidewall of the first recess.

2. The method of claim 1, wherein the slanted sidewall of the first recess having a substantially constant sidewall angle with respect to a top surface of the first substrate, wherein the sidewall angle of the first recess is not substantially perpendicular to the top surface of the first substrate.

3. The method of claim 2, wherein the sidewall of the first device has a substantially constant angle with respect to a top surface of the first device that is about the same as the sidewall angle of the first recess.

4. The method of claim 2, wherein the sidewall angle is about 54.7 degrees.

5. The method of claim 1, further comprising forming a redistribution layer over the first device and over the first substrate.

6. The method of claim 1, further comprising forming a second recess in the first substrate and further comprising placing a second device in the second recess.

7. The method of claim 6, wherein the first device comprises a first semiconductor material and the second device comprises a second semiconductor material that is different than the first semiconductor material.

8. The method of claim 1, wherein placing a first device into the first recess comprises sliding a portion of a sidewall of the first device along a portion of the slanted sidewall of the first recess, the sidewall of the first device physically contacting the slanted sidewall of the first recess.

9. The method of claim 1, wherein forming the first device comprises removing portions of a dielectric layer disposed on a second substrate.

10. A method comprising:
    attaching a first semiconductor device and a second semiconductor device to a supporting film; and
    aligning the first semiconductor device to a substrate, the aligning comprising:
      inserting a protruding portion of the first semiconductor device at least partially into a first recess formed in a top surface of the substrate, wherein the protruding portion of the first semiconductor device has a tapered profile, and wherein the inserting causes a translation of the first semiconductor device both laterally and toward a bottom surface of the substrate, wherein the second semiconductor device is attached to the supporting film and disposed further from the substrate than the first semiconductor device while the first semiconductor device is being aligned to the substrate.

11. The method of claim 10, further comprising impinging a sidewall of the protruding portion of the first semiconductor device on a sidewall of the first recess.

12. The method of claim 10, further comprising leveling a top surface of the first semiconductor device with respect to the top surface of the substrate.

13. The method of claim 10, further comprising bonding the first semiconductor device to the substrate.

14. The method of claim 13, wherein the bonding comprises forming a direct bond between the first semiconductor device and the substrate.

15. The method of claim 10, wherein a height of the protruding portion of the first semiconductor device is less than a depth of the first recess.

16. The method of claim 10, wherein the protruding portion of the first semiconductor device comprises a dielectric material.

17. The method of claim 10, further comprising detaching the first semiconductor device from the supporting film.

18. A semiconductor device comprising:
    a substrate comprising a plurality of recesses in a top surface of the substrate, wherein a depth of the plurality of recesses is smaller than a thickness of the substrate, wherein the depth and the thickness are measured along a direction from the top surface of the substrate to a bottom surface of the substrate opposing the top surface; and a plurality of chiplets disposed respectively in the plurality of recesses, wherein the plurality of chiplets are bonded to the substrate, wherein a bottom of at least one of the plurality of chiplets is separate from a bottom of at least one of the plurality of recesses.

19. The semiconductor device of claim 18, wherein a first chiplet of the plurality of chiplets comprises a different semiconductor material than a second chiplet of the plurality of chiplets.

20. The semiconductor device of claim 18, further comprising a redistribution layer disposed over the plurality of chiplets and the substrate, wherein the redistribution layer is electrically connected to the plurality of chiplets.

* * * * *